United States Patent
Dokai et al.

(10) Patent No.: US 7,932,730 B2
(45) Date of Patent: Apr. 26, 2011

(54) SYSTEM FOR INSPECTING ELECTROMAGNETIC COUPLING MODULES AND RADIO IC DEVICES AND METHOD FOR MANUFACTURING ELECTROMAGNETIC COUPLING MODULES AND RADIO IC DEVICES USING THE SYSTEM

(75) Inventors: Yuya Dokai, Nagaokakyo (JP); Noboru Kato, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 176 days.

(21) Appl. No.: 12/274,400

(22) Filed: Nov. 20, 2008

(65) Prior Publication Data
US 2009/0066592 A1   Mar. 12, 2009

Related U.S. Application Data

(63) Continuation of application No. PCT/JP2007/060344, filed on May 21, 2007.

(30) Foreign Application Priority Data

Jun. 12, 2006  (JP) .................... 2006-162675
Aug. 31, 2006  (JP) .................... 2006-236776

(51) Int. Cl.
   *G01R 31/02*    (2006.01)
   *G01R 29/08*    (2006.01)
(52) U.S. Cl. .................. 324/537; 324/512; 343/703
(58) Field of Classification Search .................. 324/537, 324/76.11, 512; 343/703
   See application file for complete search history.

(56) References Cited

U.S. PATENT DOCUMENTS

| | | |
|---|---|---|
| 3,364,564 A | 1/1968 | Kurtz et al. |
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,757,074 A | 5/1998 | Malloubian et al. |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |

(Continued)

FOREIGN PATENT DOCUMENTS

EP     0 977 145 A2     2/2000

(Continued)

OTHER PUBLICATIONS

Official Communication issued in International Patent Application No. PCT/JP2007/060344, mailed on Aug. 14, 2007.

(Continued)

*Primary Examiner* — Vincent Q Nguyen
(74) *Attorney, Agent, or Firm* — Keating & Bennett, LLP

(57) ABSTRACT

A system for inspecting an electromagnetic coupling module includes a radio IC chip and a feeder circuit board on which the radio IC chip is mounted, the feeder circuit board includes a feeder circuit including an inductance element. This inspecting system measures the electromagnetic coupling module by electromagnetically coupling a probe of a measuring device to the electromagnetic coupling module by at least one of electrostatic coupling and electromagnetic coupling. In addition, the electromagnetic coupling modules are manufactured using this inspecting system.

24 Claims, 16 Drawing Sheets

U.S. PATENT DOCUMENTS

| | | | |
|---|---|---|---|
| 6,104,311 A | 8/2000 | Lastinger | |
| 6,107,920 A | 8/2000 | Eberhardt et al. | |
| 6,172,608 B1 | 1/2001 | Cole | |
| 6,181,287 B1 | 1/2001 | Beigel | |
| 6,190,942 B1 | 2/2001 | Wilm et al. | |
| 6,236,223 B1 * | 5/2001 | Brady et al. | 324/765 |
| 6,259,369 B1 | 7/2001 | Monico | |
| 6,271,803 B1 | 8/2001 | Watanabe et al. | |
| 6,335,686 B1 | 1/2002 | Goff et al. | |
| 6,362,784 B1 | 3/2002 | Kane et al. | |
| 6,367,143 B1 | 4/2002 | Sugimura | |
| 6,378,774 B1 | 4/2002 | Emori et al. | |
| 6,406,990 B1 | 6/2002 | Kawai | |
| 6,448,874 B1 | 9/2002 | Shiino et al. | |
| 6,462,716 B1 | 10/2002 | Kushihi | |
| 6,542,050 B1 | 4/2003 | Arai et al. | |
| 6,600,459 B2 | 7/2003 | Yokoshima et al. | |
| 6,634,564 B2 | 10/2003 | Kuramochi | |
| 6,664,645 B2 | 12/2003 | Kawai | |
| 6,763,254 B2 | 7/2004 | Nishikawa | |
| 6,828,881 B2 | 12/2004 | Mizutani et al. | |
| 6,927,738 B2 | 8/2005 | Senba et al. | |
| 6,963,729 B2 | 11/2005 | Uozumi | |
| 7,088,307 B2 | 8/2006 | Imaizumi | |
| 7,112,952 B2 | 9/2006 | Arai et al. | |
| 7,119,693 B1 | 10/2006 | Devilbiss | |
| 7,129,834 B2 | 10/2006 | Naruse et al. | |
| 7,248,221 B2 | 7/2007 | Kai et al. | |
| 7,250,910 B2 | 7/2007 | Yoshikawa et al. | |
| 7,276,929 B2 | 10/2007 | Arai et al. | |
| 7,317,396 B2 | 1/2008 | Ujino | |
| 7,405,664 B2 | 7/2008 | Sakama et al. | |
| 2002/0011967 A1 | 1/2002 | Goff et al. | |
| 2002/0044092 A1 | 4/2002 | Kushihi | |
| 2002/0067316 A1 | 6/2002 | Yokoshima et al. | |
| 2004/0001027 A1 | 1/2004 | Killen et al. | |
| 2004/0217915 A1 | 11/2004 | Imaizumi | |
| 2004/0219956 A1 | 11/2004 | Iwai et al. | |
| 2004/0227673 A1 | 11/2004 | Iwai et al. | |
| 2005/0092836 A1 | 5/2005 | Kudo | |
| 2005/0099337 A1 | 5/2005 | Takei et al. | |
| 2005/0125093 A1 | 6/2005 | Kikuchi et al. | |
| 2005/0140512 A1 | 6/2005 | Sakama et al. | |
| 2005/0232412 A1 | 10/2005 | Ichihara et al. | |
| 2005/0236623 A1 | 10/2005 | Takechi et al. | |
| 2005/0275539 A1 | 12/2005 | Sakama et al. | |
| 2006/0001138 A1 | 1/2006 | Sakama et al. | |
| 2006/0055601 A1 | 3/2006 | Kameda et al. | |
| 2006/0071084 A1 | 4/2006 | Detig et al. | |
| 2006/0109185 A1 | 5/2006 | Iwai et al. | |
| 2006/0158380 A1 | 7/2006 | Son et al. | |
| 2006/0267138 A1 | 11/2006 | Kobayashi | |
| 2007/0004028 A1 | 1/2007 | Lair et al. | |
| 2007/0018893 A1 | 1/2007 | Kai et al. | |
| 2007/0040028 A1 | 2/2007 | Kawamata | |
| 2007/0052613 A1 | 3/2007 | Gallschuetz et al. | |
| 2007/0120571 A1 * | 5/2007 | Huie | 324/512 |
| 2007/0252700 A1 | 11/2007 | Ishihara et al. | |
| 2007/0285335 A1 | 12/2007 | Bungo et al. | |
| 2008/0024156 A1 | 1/2008 | Arai et al. | |
| 2008/0169905 A1 | 7/2008 | Slatter | |
| 2008/0224922 A1 * | 9/2008 | Cleland et al. | 342/175 |
| 2008/0272885 A1 | 11/2008 | Atherton | |
| 2009/0002130 A1 | 1/2009 | Kato | |

FOREIGN PATENT DOCUMENTS

| | | |
|---|---|---|
| JP | 50-143451 A | 11/1975 |
| JP | 62-127140 U | 8/1987 |
| JP | 05-327331 A | 12/1993 |
| JP | 6-53733 A | 2/1994 |
| JP | 06-077729 A | 3/1994 |
| JP | 06-177635 A | 6/1994 |
| JP | 07-183836 A | 7/1995 |
| JP | 08-056113 A | 2/1996 |
| JP | 8-87580 A | 4/1996 |
| JP | 11-149537 A | 6/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-245381 A | 9/1997 |
| JP | 09-252217 A | 9/1997 |
| JP | 09-270623 A | 10/1997 |
| JP | 10-505466 A | 5/1998 |
| JP | 10-171954 A | 6/1998 |
| JP | 10-293828 A | 11/1998 |
| JP | 11-149538 A | 6/1999 |
| JP | 11-219420 A | 8/1999 |
| JP | 11-328352 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2005-229474 A | 1/2000 |
| JP | 2000-059260 A | 2/2000 |
| JP | 2000-085283 A | 3/2000 |
| JP | 2000-132643 A | 5/2000 |
| JP | 2000-137778 A | 5/2000 |
| JP | 2000-148948 A | 5/2000 |
| JP | 2000-172812 A | 6/2000 |
| JP | 2000-510271 A | 8/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 2001-028036 A | 1/2001 |
| JP | 2007-18067 A | 1/2001 |
| JP | 2001-66990 A | 3/2001 |
| JP | 2001-168628 A | 6/2001 |
| JP | 2001-256457 A | 9/2001 |
| JP | 2001-514777 A | 9/2001 |
| JP | 2001-319380 A | 11/2001 |
| JP | 2001-331976 A | 11/2001 |
| JP | 2001-332923 A | 11/2001 |
| JP | 2001-344574 A | 12/2001 |
| JP | 2001-351084 A | 12/2001 |
| JP | 2002-024776 A | 1/2002 |
| JP | 2002-042076 A | 2/2002 |
| JP | 2002-505645 A | 2/2002 |
| JP | 2002-76750 A | 3/2002 |
| JP | 2002-150245 A | 5/2002 |
| JP | 2002-175508 A | 6/2002 |
| JP | 2002-183690 A | 6/2002 |
| JP | 2002-185358 A | 6/2002 |
| JP | 2002-204117 A | 7/2002 |
| JP | 2002-230128 A | 8/2002 |
| JP | 2002-298109 A | 10/2002 |
| JP | 2002-319008 A | 10/2002 |
| JP | 2002-362613 A | 12/2002 |
| JP | 2002-373029 A | 12/2002 |
| JP | 2002-373323 A | 12/2002 |
| JP | 2003-016412 A | 1/2003 |
| JP | 2003-030612 A | 1/2003 |
| JP | 2003-44789 A | 2/2003 |
| JP | 2003-044789 A | 2/2003 |
| JP | 2003-58840 A | 2/2003 |
| JP | 2003-067711 A | 3/2003 |
| JP | 2003-076947 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099720 A | 4/2003 |
| JP | 2003-099721 A | 4/2003 |
| JP | 2003-110344 A | 4/2003 |
| JP | 2003-132330 | 5/2003 |
| JP | 2003-132330 A | 5/2003 |
| JP | 2003-134007 A | 5/2003 |
| JP | 2003-155062 A | 5/2003 |
| JP | 2003-158414 A | 5/2003 |
| JP | 2003-187207 A | 7/2003 |
| JP | 2003-187211 A | 7/2003 |
| JP | 2003-198230 A | 7/2003 |
| JP | 2003-209421 A | 7/2003 |

| | | |
|---|---|---|
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-288560 A | 10/2003 |
| JP | 2003-309418 A | 10/2003 |
| JP | 2003-332820 A | 11/2003 |
| JP | 2004-88218 A | 3/2004 |
| JP | 2004-096566 A | 3/2004 |
| JP | 2004-253858 A | 9/2004 |
| JP | 2004-287767 A | 10/2004 |
| JP | 2004-297249 A | 10/2004 |
| JP | 2004-326380 A | 11/2004 |
| JP | 2004-334268 A | 11/2004 |
| JP | 2004-336250 A | 11/2004 |
| JP | 2004-34300 A | 12/2004 |
| JP | 2004-362190 A | 12/2004 |
| JP | 2004-362341 A | 12/2004 |
| JP | 2004-362602 A | 12/2004 |
| JP | 2002-050645 A | 2/2005 |
| JP | 2005-136528 A | 5/2005 |
| JP | 2005-165839 A | 6/2005 |
| JP | 2005-167327 A | 6/2005 |
| JP | 2005-191705 A | 7/2005 |
| JP | 2005-210676 A | 8/2005 |
| JP | 2005-210680 A | 8/2005 |
| JP | 2005-217822 A | 8/2005 |
| JP | 2005-236339 A | 9/2005 |
| JP | 2005-244778 A | 9/2005 |
| JP | 2005-275870 A | 10/2005 |
| JP | 2005-295135 A | 10/2005 |
| JP | 2005-311205 A | 11/2005 |
| JP | 2005-321305 A | 11/2005 |
| JP | 2005-335755 A | 12/2005 |
| JP | 2005-346820 A | 12/2005 |
| JP | 2005-352858 A | 12/2005 |
| JP | 2006-031766 A | 2/2006 |
| JP | 2006-39902 A | 2/2006 |
| JP | 2006-67479 A | 3/2006 |
| JP | 2006-72706 A | 3/2006 |
| JP | 2006-80367 A | 3/2006 |
| JP | 2006-92630 A | 4/2006 |
| JP | 2006-102953 A | 4/2006 |
| JP | 2006-148518 A | 6/2006 |
| JP | 2006-195795 A | 7/2006 |
| JP | 2006-270212 A | 10/2006 |
| JP | 2006-309401 A | 11/2006 |
| JP | 2007-65822 A | 3/2007 |
| JP | 2007-150868 A | 6/2007 |
| JP | 11-175678 A | 1/2009 |
| NL | 9100176 A | 3/1992 |
| NL | 9100347 A | 3/1992 |
| WO | 03/079305 A1 | 9/2003 |
| WO | 2004/036772 A1 | 4/2004 |
| WO | 2004/070879 A | 8/2004 |
| WO | 2004/072892 A1 | 8/2004 |
| WO | 2004/072892 A2 | 8/2004 |
| WO | 2005/073937 A | 8/2005 |
| WO | 2005/115849 A1 | 12/2005 |
| WO | 2006/045682 A | 5/2006 |

OTHER PUBLICATIONS

Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Dokai et al.: "Wireless IC Device and Component for Wireless IC Device," U.S. Appl. No. 11/624,382, filed Jan. 18, 2007.
Dokai et al.: "Wireless IC Device, and Component for Wireless IC Device," U.S. Appl. No. 11/930,818, filed Oct. 31, 2007.
Kato et al.: "Wireless IC Device," U.S. Appl. No. 12/042,399, filed Mar. 5, 2008.
Official communication issued in related U.S. Appl. No. 12/042,399; mailed on Aug. 25, 2008.
English translation of NL9100176, published on Mar. 2, 1992.
English translation of NL9100347, published on Mar. 2, 1992.
Kato et al.: "Antenna," U.S. Appl. No. 11/928,502, filed Oct. 30, 2007.
Kato et al.: "Wireless IC Device," U.S. Appl. No. 12/211,117, filed Sep. 16, 2008.
Kato et al.: "Antenna," U.S. Appl. No. 11/688,290, filed Mar. 20, 2007.
Kato et al.: "Electromagnetic-Coupling-Module-Attached Article," U.S. Appl. No. 11/740,509, filed Apr. 26, 2007.
Kato et al.: "Product Including Power Supply Circuit Board," U.S. Appl. No. 12/234,949, filed Sep. 22, 2008.
Kato et al.: "Data Coupler," U.S. Appl. No. 12/252,475, filed Oct. 16, 2008.
Kato et al; "Information Terminal Device," U.S. Appl. No. 12/267,666, filed Nov. 10, 2008.
Kato et al.: "Wireless IC Device and Wireless IC Device Composite Component;" U.S. Appl. No. 12/276,444, filed Nov. 24, 2008.
Dokai et al.: "Optical Disc," U.S Appl. No. 12/326,916, filed Dec. 3, 2008.
Dokai et al.: "Wireless IC Device and Component for Wireless IC Device," U.S. Appl. No. 12/359,690, filed Jan. 26, 2009.
Kato: "Wireless IC Device," U.S. Appl. No. 11/964,185, filed Dec. 26, 2007.
Kato et al.: "Radio Frequency IC Device," U.S. Appl. No. 12/336,629, filed Dec. 17, 2008.
Kato et al.: "Wireless IC Device and Component for Wireless IC Device," U.S. Appl. No. 12/339,198, filed Dec. 19, 2008.
Ikemoto et al.: "Wireless IC Device," U.S. Appl. No. 11/851,651, filed Sep. 7, 2007.
Kataya et al.: "Wireless IC Device and Electronic Device," U.S. Appl. No. 11/851,661, filed Sep. 7, 2007.
Dokai et al.: "Antenna and Radio IC Device," U.S. Appl. No. 12/350,307, filed Jan. 8, 2009.

* cited by examiner

SYSTEM FOR INSPECTING ELECTROMAGNETIC COUPLING MODULES AND RADIO IC DEVICES AND METHOD FOR MANUFACTURING ELECTROMAGNETIC COUPLING MODULES AND RADIO IC DEVICES USING THE SYSTEM

BACKGROUND OF THE INVENTION

1. Field of the Invention

The present invention relates to a system for inspecting electromagnetic coupling modules and radio IC devices, and particularly, for inspecting electromagnetic coupling modules and radio IC devices used in an RFID (Radio Frequency Identification) system. Furthermore, the present invention relates to a method for manufacturing electromagnetic coupling modules and radio IC devices.

2. Description of the Related Art

Recently, techniques related to a non-contact identification medium (e.g., non-contact ID card) called RFID (Radio Frequency Identification) have been rapidly advancing, and the uses thereof have been diversified. In such RFID, a communication distance to a reader/writer, which is dependent upon the desired performance, is defined, and improvements in communication measurements and yield have been desired.

Conventionally, typical radio IC devices used in RFID systems are manufactured such that a predetermined number of radio IC devices are formed on a film base. Each of the radio IC devices includes an antenna coil provided on the film base and an IC module mounted thereon. Before each of the radio IC devices is produced as a single unit, measurements are performed on each IC module and each antenna coil during an inspection process, so that the quality of the product is determined.

However, in the above-described inspection process, the inspection is performed at a stage before each radio IC device is produced as a single unit, and thus, responses from a radio IC device to be inspected and from an adjacent radio IC device with respect to communication from an RFID reader/writer are often received together. This decreases the reliability of the data received from the RFID reader/writer. Furthermore, if the radio ID device to be inspected is defective, data from an adjacent radio IC device may be received and the inspected piece may be incorrectly determined to be acceptable, although it is actually defective.

Japanese Unexamined Patent Application Publication No. 2003-99721 and Japanese Unexamined Patent Application Publication No. 2003-76947 disclose the following inspecting system. To prevent communication with a radio IC device near a radio IC device to be inspected, a shield member having an opening is disposed between a radio IC device to be inspected and an antenna on the side of a measuring system, and the system-side antenna is arranged to face only the radio IC device to be inspected via the opening. Accordingly, responses from an adjacent radio IC device are prevented from being received along with responses from the radio IC device to be inspected.

The radio IC device to be inspected by such an inspecting system includes at least an antenna and a radio IC chip. The radio IC device including the antenna includes a very large antenna portion, and thus, a space that is substantially the size of at least about one radio IC device is required as an interval between the radio IC devices on a conveyer belt of the inspecting system. For this reason, the amount that the conveyer belt must be moved to inspect each radio IC device is relatively large, the required inspection time is relatively long, and the inspection costs are disadvantageously increased.

Furthermore, the radio IC device including at least an antenna and a radio IC chip requires a process step of mounting the radio IC chip on a film provided with an antenna electrode and electrically connecting the antenna electrode to the radio IC chip. This manufacturing process occupies a significant portion of manufacturing time, which results in increased manufacturing costs.

SUMMARY OF THE INVENTION

To overcome the problems described above, preferred embodiments of the present invention provide an inspecting system capable of efficiently inspecting electromagnetic coupling modules in a short amount of time and a method for manufacturing electromagnetic coupling modules using the inspecting system, and an inspecting system for radio IC devices capable of reliably measuring characteristics of the respective radio IC devices in a short amount of time and a method for manufacturing radio IC devices using the inspecting system.

A preferred embodiment of the present invention provides a system for inspecting an electromagnetic coupling module including a radio IC chip and a feeder circuit board on which the radio IC chip is mounted, the feeder circuit board includes a feeder circuit including an inductance element. The electromagnetic coupling module is measured by electromagnetically coupling a probe of a measuring device to the electromagnetic coupling module by at least one of electrostatic coupling and electromagnetic coupling.

In a method for manufacturing electromagnetic coupling modules according to a preferred embodiment of the present invention, electromagnetic coupling modules are manufactured using the system for inspecting electromagnetic coupling modules.

A preferred embodiment of the present invention provides a system for inspecting a radio IC device including a radio IC chip and a radiator. The radio IC device is measured by electromagnetically coupling a probe of a measuring device to a portion of the radiator by at least one of electrostatic coupling and electromagnetic coupling.

A preferred embodiment of the present invention provides a system for inspecting a radio IC device including a radio IC chip, a feeder circuit board on which the radio IC chip is mounted, the feeder circuit board includes a feeder circuit including an inductance element, and a radiator that is connected to the feeder circuit board and that radiates a transmission signal supplied from the feeder circuit and receives a reception signal and supplies the reception signal to the feeder circuit. The radio IC device is measured by electromagnetically coupling a probe of a measuring device to a portion of the radiator by at least one of electrostatic coupling and electromagnetic coupling.

Furthermore, in a method for manufacturing radio IC devices according to a preferred embodiment of the present invention, radio IC devices are manufactured by using the system for inspecting radio IC devices.

With the system for inspecting an electromagnetic coupling module according to preferred embodiments of the present invention, an electromagnetic coupling module including a radio IC chip and a feeder circuit board on which the radio IC chip is mounted and that includes a feeder circuit including an inductance element, can be efficiently inspected in short amount of time without contact on a probe of a measuring device by using electromagnetic-field coupling.

When the quality of a radio IC device including an electromagnetic coupling module and a radiator that is arranged to be coupled to the electromagnetic coupling module by at least one of electrostatic coupling and magnetic-field coupling is to be inspected, inspection may be performed on only the desired electromagnetic coupling module. Thus, radio wave interference between electromagnetic coupling modules does not occur even if the electromagnetic coupling modules are disposed in close proximity to each other with small intervals therebetween. Accordingly, the inspection time for each electromagnetic coupling module can be significantly reduced as compared to conventional inspection times for a radio IC device including at least an antenna and a radio IC chip.

Furthermore, a process required to manufacture a conventional radio IC device, that is, a process of mounting a radio IC chip on a film provided with an antenna electrode and electrically connecting the antenna electrode and the radio IC chip, is not required. Accordingly, the manufacturing process can be simplified and shortened, and the manufacturing cost can be reduced.

With the system for inspecting radio IC devices according to preferred embodiments of the present invention, a characteristic of a radio IC device is measured by electromagnetically coupling a probe of a measuring device to a portion of a radiator by at least one of electrostatic coupling and electromagnetic coupling. Thus, a low-power inspection signal is effectively supplied from the probe to the radio IC chip via the radiator and is input to the radio IC device to be inspected. In addition, transmission data from the radio IC device to be inspected is transmitted to the measuring device from the radiator via the probe, and thus, radio IC devices adjacent to each other do not interfere with the measurement. When many radio IC devices are sequentially inspected, even small intervals between the radio IC devices do not cause any interference with the measurement. Accordingly, the inspection time and the manufacturing time are reduced.

That is, with the system for inspecting radio IC devices according to preferred embodiments of the present invention, a characteristic of a radio IC device including a radio IC chip and a radiator can be efficiently inspected without errors. Accordingly, radio IC devices can be efficiently manufactured in a short amount of time.

Other features, elements, steps, characteristics and advantages of the present invention will become more apparent from the following detailed description of preferred embodiments of the present invention with reference to the attached drawings.

BRIEF DESCRIPTIONS OF DRAWINGS

DETAILED DESCRIPTION OF PREFERRED EMBODIMENTS

Figure 1:
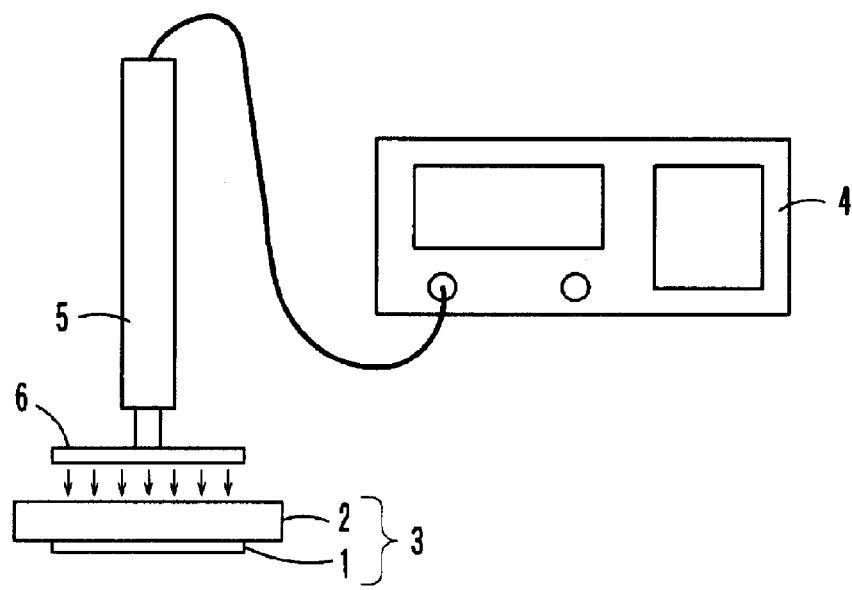
FIG. 1 illustrates a basic configuration of a system for inspecting electromagnetic coupling modules according to a preferred embodiment of the present invention.

Hereinafter, preferred embodiments of a system for inspecting electromagnetic coupling modules, a system for inspecting radio IC devices, a method for manufacturing electromagnetic coupling modules using the system, and a method for manufacturing radio IC devices using the system according to the present invention are described with reference to the attached drawings. In the drawings, an electromagnetic coupling module, a radio IC device, and an inspecting system are schematically illustrated, and the scale ratios of respective components do not necessarily correspond to each other. In the drawings, similar members and similar components are denoted by the same reference numerals and redundant descriptions are omitted.

Inspecting System and Electromagnetic Coupling Module

FIG. 1 illustrates a system for inspecting electromagnetic coupling modules according to a preferred embodiment of the present invention. As illustrated in FIG. 1, an electromagnetic coupling module 3 including a radio IC chip 1 mounted on a feeder circuit board 2 is inspected using a probe 5 connected to a measuring device 4. Inspection of the electromagnetic coupling module 3 is performed by electromagnetically coupling a top portion 6 of the probe 5 to the electromagnetic coupling module 3 by electrostatic coupling and/or electromagnetic coupling.

That is, a memory 4 of the measuring device 4 stores all of the inspection items of the electromagnetic coupling module 3 and all specifications, e.g., usable frequency, command, and other parameters, of a radio system. Inspection of the electromagnetic coupling module 3 is performed in accordance with the inspection items.

Specifically, the type of radio system used in the electromagnetic coupling module 3, a measuring frequency, and a command used to transmit/receive data that is unique to the system which indicates the digital data being used are set, and the inspection items of the electromagnetic coupling module 3 are set. Then, the probe 5 connected to the measuring device 4 is located so as to be adjacent to the electromagnetic coupling module 3, and then a signal (e.g., a frequency shift keying signal) of information to be transmitted to the electromagnetic coupling module 3 is transmitted from a transmitter of the measuring device 4 to the probe 5. The top portion 6 of the probe 5 has a substantially flat shape and thus can be brought into close proximity to or in contact with the feeder circuit board 2 of the electromagnetic coupling module 3. Therefore, the top portion 6 of the probe 5 and the electromagnetic coupling module 3 can achieve electromagnetic-field coupling in which electrostatic coupling is relatively strong. Accordingly, the electromagnetic coupling module 3 can receive a transmission signal transmitted from the measuring device 4. The top portion 6 of the probe 5 can be coupled to the electromagnetic coupling module 3 in an electromagnetic field even if the top portion 6 is disposed above the feeder circuit board 2 so as to be spaced therefrom.

Subsequently, the electromagnetic coupling module 3 performs demodulation and data processing on the received signal by the radio IC chip 1, converts the data that is required to be transmitted to the measuring device 4 to a transmission data signal, and transmits the transmission data signal to the top portion 6 of the probe 5 from a feeder circuit element in the feeder circuit board 2 by electromagnetic-field coupling. Then, the transmission data signal is received by the probe 5 and is transmitted to the measuring device 4.

After performing demodulation and data processing on the data signal from the electromagnetic coupling module 3, the measuring device 4 determines whether the electromagnetic coupling module 3 satisfies all the inspection items. If the electromagnetic coupling module 3 satisfies all of the inspection items, the measuring device 4 determines that the inspected electromagnetic coupling module 3 is an acceptable product. If the electromagnetic coupling module 3 does not satisfy all of the inspection items, the measuring device 4 determines that the inspected electromagnetic coupling module 3 is a defective product. In this manner, the electromagnetic coupling module 3 can be inspected at high speed in a non-contact manner.

In addition, by enabling the above-described electromagnetic coupling module 3 to electromagnetically couple to a metallic radiator, the radiator can be used as a high-performance antenna, and the electromagnetic coupling module 3 can be used as a radio communication module used for various types of radio communication. Furthermore, a radio IC device including the electromagnetic coupling module 3 and a metallic-film radiator can be used for distribution management of products, management of fixed assets, and other suitable purposes.

Figure 2:
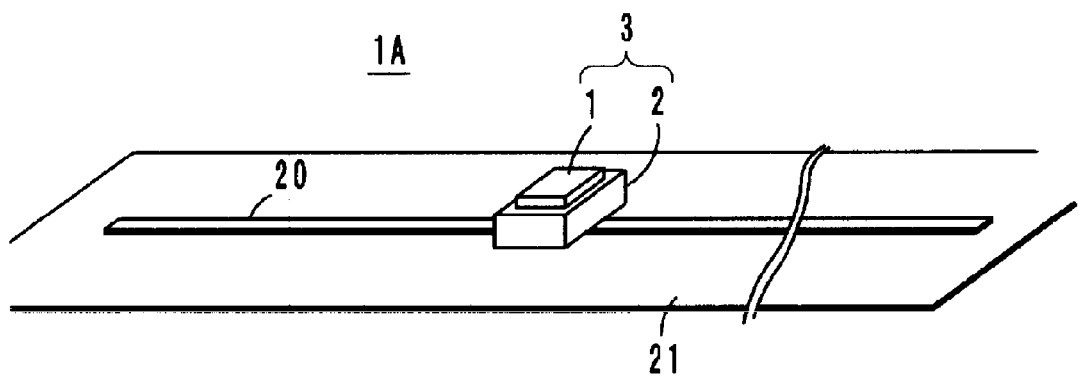
FIG. 2 is a perspective appearance view illustrating an example of a radio IC device including an electromagnetic coupling module.
Figure 3:
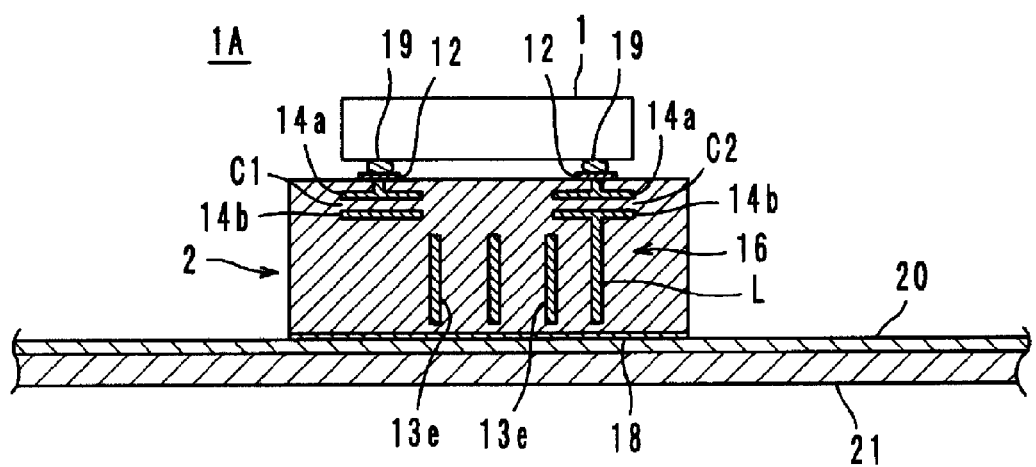
FIG. 3 is a cross-sectional view of the radio IC device.

Hereinafter, configurations of the electromagnetic coupling module 3 and a radio IC device according to preferred embodiments of the present invention will be described in detail with reference to the drawings in which the electromagnetic coupling module 3 is combined with a metallic-film radiator so as to be used as a radio IC device. As illustrated in FIGS. 2 and 3, the electromagnetic coupling module 3 includes the radio IC chip 1 and the feeder circuit board 2 provided with the radio IC chip 1 on its upper surface. The electromagnetic coupling module 3 is adhered on a metallic-film radiator 20, whereby a radio IC device 1A is defined. The radio IC chip 1 includes a clock circuit, a logic circuit, and a memory circuit, stores necessary information, and is directly DC-connected to a feeder circuit 16 that is included in the feeder circuit board 2 and that is described below.

The feeder circuit 16 is a circuit to supply transmission signals having a predetermined frequency to the metallic-film radiator 20 and/or a circuit to select a reception signal having a predetermined frequency from among the signals received by the metallic-film radiator 20 and supply the signal to the radio IC chip 1, and includes a resonance circuit that resonates at the frequencies of transmission and reception signals.

Figure 4:
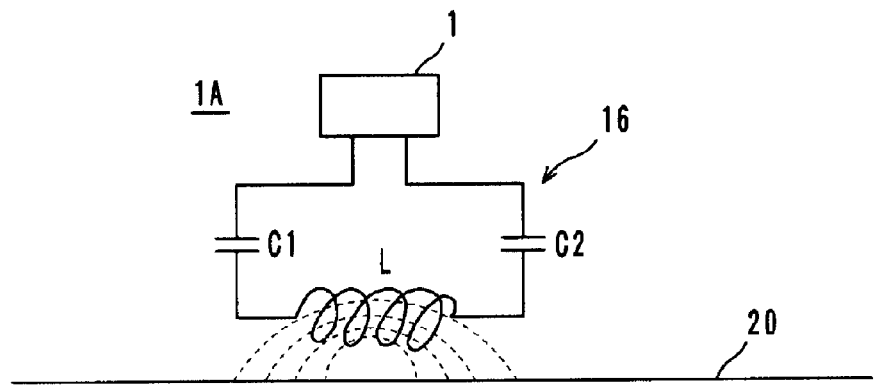
FIG. 4 is an equivalent circuit diagram of the radio IC device.
Figure 5:
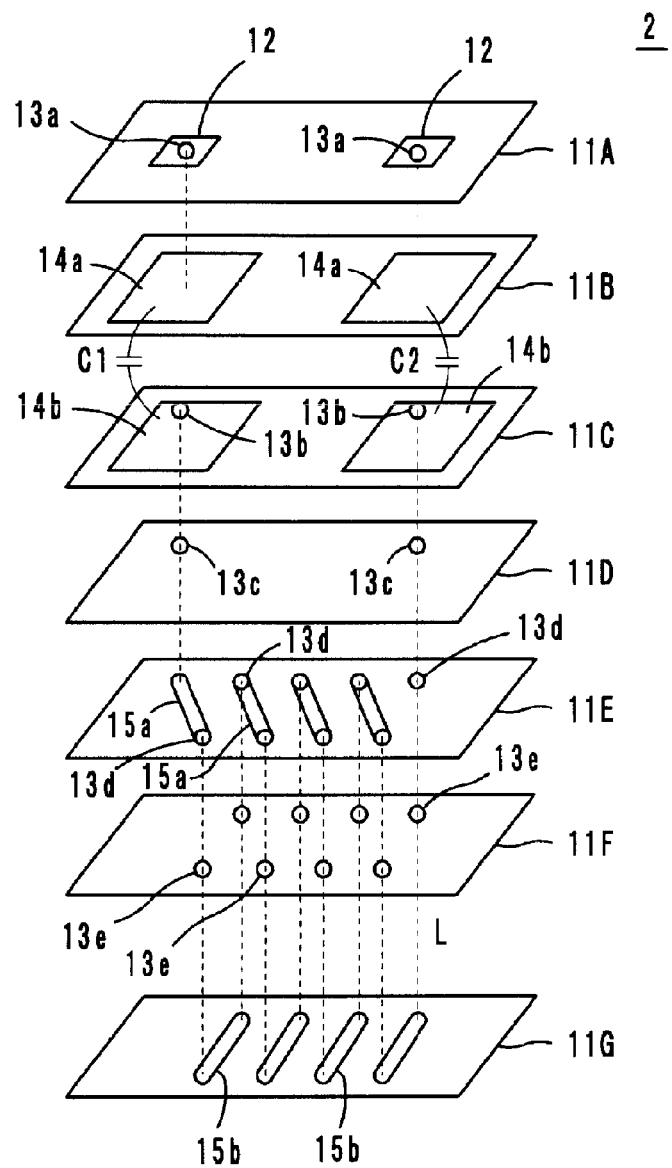
FIG. 5 is an exploded structure view of a feeder circuit board of the electromagnetic coupling module.

As illustrated in FIGS. 3 and 4, the feeder circuit board 2 includes the feeder circuit 16 that includes a lumped-constant LC series resonance circuit including a helical inductance element L and capacitance elements C1 and C2. Specifically, as illustrated in FIG. 5, the feeder circuit board 2 is formed by laminating, crimping, and firing dielectric ceramic sheets 11A to 11G, and includes the sheet 11A provided with connecting electrodes 12 and via-hole conductors 13a, the sheet 11B provided with capacitor electrodes 14a, the sheet 11C provided with capacitor electrodes 14b and via-hole conductors 13b, the sheet 11D provided with via-hole conductors 13c, the sheet 11E provided with conductor patterns 15a and via-hole conductors 13d, at least one sheet 11F provided with via-hole conductors 13e, and the sheet 11G provided with conductor patterns 15b. Each of the ceramic sheets 11A to 11G may preferably be a sheet made of a magnetic ceramic material. The feeder circuit board 2 can be easily produced by a process of manufacturing a multilayer substrate, such as a sheet laminating method and a thick-film printing method that have been conventionally used.

The lamination of the above-described sheets 11A to 11G produces the inductance element L in which a helical turning axis is substantially parallel to the radiator 20 and the capacitance elements C1 and C2 in which the capacitor electrodes 14b are connected to both ends of the inductance element L and the capacitor electrodes 14a are connected to the connecting electrodes 12 via the via-hole conductors 13a. In addition, the connecting electrodes 12 defining a substrate-side electrode pattern are DC-connected to a chip-side electrode pattern (not shown) of the radio IC chip via solder bumps 19.

That is, transmission signals are supplied to the radiator 20 from the inductance element L which defines a coil electrode pattern among the elements defining the feeder circuit via a magnetic field. Reception signals from the radiator 20 are supplied to the inductance element L via a magnetic field. Therefore, it is preferable that the inductance element L of the resonance circuit in the feeder circuit board 2 is disposed in the vicinity of the radiator 20.

In this example, the radiator 20 has an elongated shape and is made of a non-magnetic material, such as aluminum foil or copper foil, for example, that is, a two-end-opened metallic piece, and is provided on an article having an insulating flexible resin film 21, such as PET, for example, as an element assembly. The lower surface of the feeder circuit board 2 is adhered on the radiator 20 via an insulating adhesive layer 18.

Preferably, the radio IC chip 1 has a thickness of about 50 µm to about 100 µm, the solder bump 19 has a thickness of about 20 µm, the feeder circuit board 2 has a thickness of about 200 µm to about 500 µm, the adhesive 18 has a thickness of about 0.1 µm to about 10 µm, the radiator 20 has a thickness of about 1 µm to about 50 µm, and the film 21 has a thickness of about 10 µm to about 100 µm, for example. The area of the radio IC chip 1 varies, e.g., about 0.4 mm×about 0.4 mm or about 0.9 mm×about 0.8 mm. The area of the feeder circuit board 2 may preferably be in the range from substantially the same size as that of the radio IC chip 1 to about 3 mm×about 3 mm.

Figure 6A:
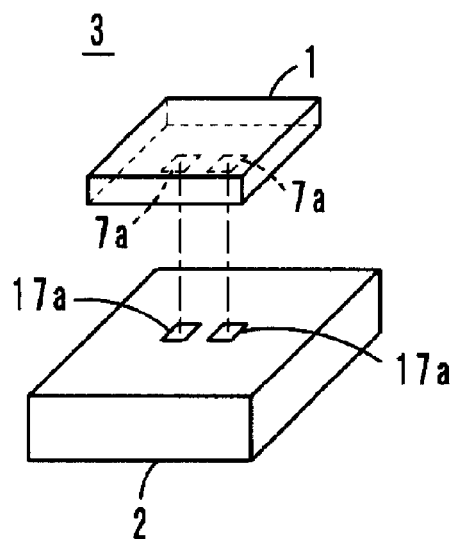
FIGS. 6A and 6B are perspective views illustrating a connection state between a radio IC chip and a feeder circuit board.
Figure 6B:
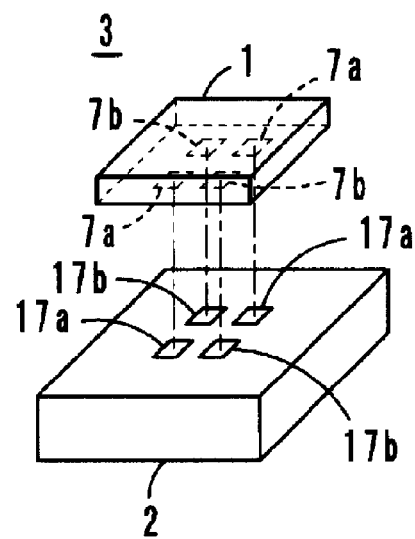

FIGS. 6A and 6B illustrate connection arrangements between the radio IC chip 1 and the feeder circuit board 2. In FIG. 6A, pairs of balanced antenna terminals 7a and 17a are provided on a rear surface of the radio IC chip 1 and a front surface of the feeder circuit board 2, respectively. FIG. 6B illustrates another connection arrangement, in which ground terminals 7b and 17b are provided in addition to the pairs of balanced antenna terminals 7a and 17a on the rear surface of the radio IC chip 1 and the front surface of the feeder circuit board 2, respectively. Note that the ground terminals 17b on the feeder circuit board 2 are terminated and are not connected to another element of the feeder circuit board 2.

FIG. 4 illustrates an equivalent circuit of the radio IC device 1A. The radiator 20 of the radio IC device 1A receives radio frequency signals (e.g., in a UHF frequency band) radiated by a reader/writer (not illustrated), enables the feeder circuit 16 (LC series resonance circuit including the inductance element L and the capacitance elements C1 and C2) primarily magnetically coupled to the radiator 20 to resonate, and supplies only a reception signal in a predetermined frequency band to the radio IC chip 1. On the other hand, the radio IC device 1A extracts predetermined energy from the reception signal, matches the information stored in the radio IC chip 1 to a predetermined frequency using the energy as a driving source in the feeder circuit 16, transmits a transmission signal to the radiator 20 from the inductance element L of the feeder circuit 16 via magnetic-field coupling, and transmits/transfers the transmission signal to the reader/writer from the radiator 20.

The coupling between the feeder circuit 16 and the radiator 20 is preferably performed primarily via a magnetic field, but the coupling may alternatively be performed via an electric field. In the present application, "electromagnetic-field coupling" means coupling via an electric field and/or a magnetic field.

In the electromagnetic coupling module 3, the radio IC chip 1 is directly DC-connected to the feeder circuit board 2 including the feeder circuit 16. The feeder circuit board 2 has substantially the same area as that of the radio IC chip 1 and is rigid. Thus, the radio IC chip 1 can be mounted thereon with improved positional accurate as compared to conventional mounting on a flexible film having a large area. Furthermore, the feeder circuit board 2 is preferably made of a ceramic material that is heat resistance, and thus the radio IC chip 1 can be soldered to the feeder circuit board 2. In other words, since an ultrasonic joining method is not used as in a conventional art, the cost can be reduced and breakage of the radio IC chip 1 caused by stress applied during ultrasonic joining can be prevented. In addition, a self-alignment effect of solder reflow can be utilized.

In the feeder circuit 16, a resonance frequency characteristic is determined by the resonance circuit including the inductance element L and the capacitance elements C1 and C2. The resonance frequency of a signal radiated from the radiator 20 substantially corresponds to the self-resonance frequency of the feeder circuit 16, and the maximum gain of the signal is substantially determined by at least any one of the size and the shape of the feeder circuit 16 and the distance and the medium between the feeder circuit 16 and the radiator 20. Specifically, in this preferred embodiment, the electrical length of the radiator 20 is preferably defined as a half of the wavelength $\lambda$ corresponding to the resonance frequency. Note that the electrical length of the radiator 20 is not necessarily an integral multiple of $\lambda/2$. That is, the frequency of signals radiated from the radiator 20 substantially depends on the resonance frequency of the resonance circuit (i.e., the feeder circuit 16), and thus, the frequency characteristic does not substantially depend on the electrical length of the radiator 20. Preferably, the electrical length of the radiator 20 should be an integral multiple of $\lambda/2$, because a maximum gain can be obtained with this electrical length.

As described above, the resonance frequency characteristic of the feeder circuit 16 is determined by the resonance circuit including the inductance element L and the capacitance elements C1 and C2 included in the feeder circuit board 2, and thus, the resonance frequency characteristic does not change even when the radio IC device 1A is sandwiched by books. Furthermore, the resonance frequency characteristic does not change even when the shape of the radiator 20 is changed by rolling the radio IC device 1A or when the size of the radiator 20 is changed. The coil electrode pattern defining the inductance element L has a winding axis that is substantially parallel to the radiator 20, and thus, the center frequency does not vary. In addition, since the capacitance elements C1 and C2 are disposed in a subsequent stage of the radio IC chip 1, a low-frequency surge can be reduced by the elements C1 and C2, such that the radio IC chip 1 is protected against the surge.

Furthermore, the feeder circuit board 2 is preferably made of a rigid multilayer substrate, and thus, can be conveniently handled when the radio IC chip 1 is soldered thereto. Furthermore, the radiator 20 is preferably made of a flexible metallic film, and thus, can be easily provided on a film for wrapping clothes or on the surface of a cylindrical body such as a PET bottle, for example.

In various preferred embodiments of the present invention, the resonance circuit may preferably also function as a matching circuit to provide impedance matching between the radio IC chip 1 and the radiator 20. Alternatively, the feeder circuit board 2 may preferably further include a matching circuit that is provided separately from the resonance circuit and that includes an inductance element and capacitance elements. If the function of the matching circuit is added to the resonance circuit, the design of the resonance circuit is likely to be complicated. If the matching circuit is provided separately from the resonance circuit, each of the resonance circuit and the matching circuit may be independently designed, which simplifies the design thereof.

Figure 7:
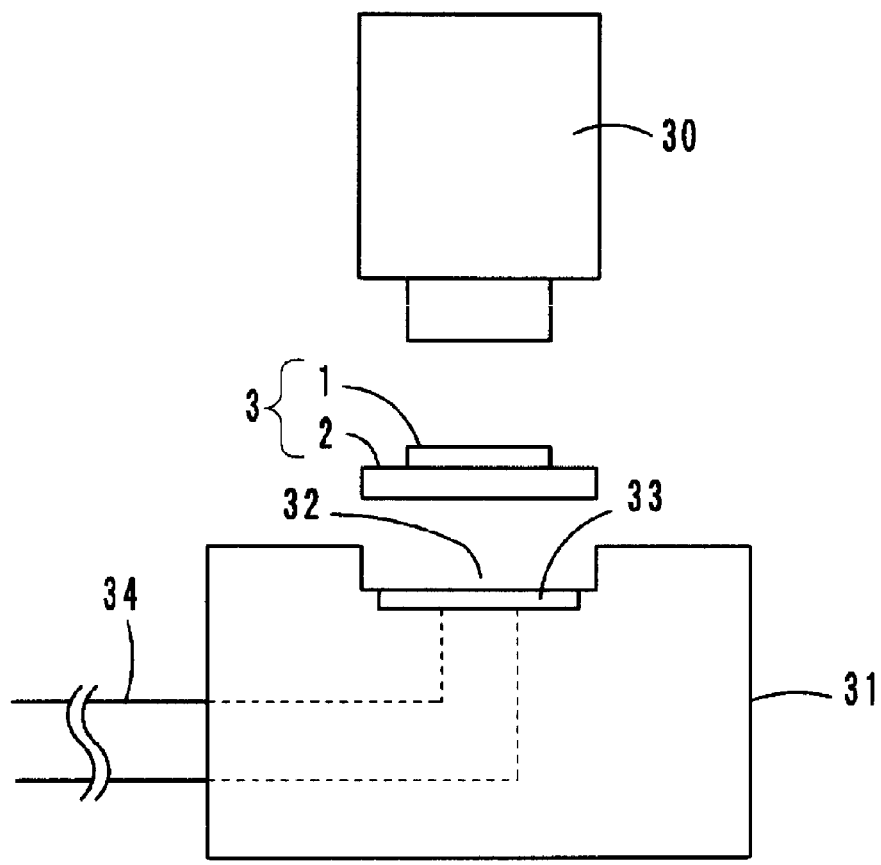
FIG. 7 is a schematic elevation view illustrating a first example of an inspecting process in a method for manufacturing electromagnetic coupling modules according to a preferred embodiment of the present invention.

First Example of Inspecting Process in Process of Manufacturing Electromagnetic Coupling Modules A first example of an inspecting process in a process of manufacturing the electromagnetic coupling module 3 will be described. FIG. 7 schematically illustrates a first example of the inspecting process during manufacturing of the electromagnetic coupling module 3.

That is, an inspecting jig 31 is provided with a depressed portion 32 in which the electromagnetic coupling module 3 is fixed. Furthermore, a metallic substantially flat plate 33 is provided on a bottom surface of the depressed portion 32. The metallic substantially flat plate 33 is electrically connected to a coaxial cable 34 that is connected to the measuring device 4 (see FIG. 1). Then, the electromagnetic coupling module 3 is disposed in the depressed portion 32 of the inspecting jig 31 by a suction bar 30 that automatically provides suction to the electromagnetic coupling module 3 in conjunction with the measuring device 4 via computer control.

At this time, the metallic substantially flat plate 33 of the inspecting jig 31 is disposed in close contact with the electromagnetic coupling module 3. Accordingly, the substantially flat plate 33 and the electromagnetic coupling module 3 can be coupled to each other in an electromagnetic field in a state in which electrostatic coupling is relatively strong. In this state, a command to inspect the electromagnetic coupling module 3 is transmitted from the computer to the measuring device 4, and then a transmission data signal including inspection items is transmitted from the measuring device 4 to the electromagnetic coupling module 3. At this time, electromagnetic coupling between the metallic flat plate 33 and the feeder circuit board 2 of the electromagnetic coupling module 3 enables the electromagnetic coupling module 3 to receive the transmission data signal. Then, demodulation and data processing are performed on the received signal in the radio IC chip 1 of the electromagnetic coupling module 3, and a required data signal is transmitted from the radio IC chip 1 to the feeder circuit board 2.

The data signal is transmitted to the metallic substantially flat plate 33 by electromagnetic-field coupling, and is further transmitted to the measuring device 4 through the coaxial cable 34. The measuring device 4 performs demodulation and data processing on the transmitted signal, determines whether the inspected electromagnetic coupling module 3 satisfies all of the inspection items, and determines whether the electromagnetic coupling module 3 is an acceptable product or a defective product.

Data about the determination is transmitted from the measuring device 4 to the computer. If the measuring device 4 has determined that the electromagnetic coupling module 3 is an acceptable product, instructions to proceed to a taping process are transmitted to a controller of the suction bar 30. Then, the suction bar 30 provides suction to the electromagnetic coupling module 3 and transports it to the taping process. If the measuring device 4 has determined that the electromagnetic coupling module 3 is a defective product, instructions to supply it to a defective-product tray are transmitted to the controller of the suction bar 30. Then, the suction bar 30 provides suction to the electromagnetic coupling module 3 and transports it to the defective-product tray. Then, electromagnetic coupling modules 3 to be inspected are sequentially subjected to suction by the suction bar 30 and transported to the inspecting jig 31, inspection is performed in the above-described manner, and each electromagnetic coupling module 3 is determined to be an acceptable product or a defective product. Electromagnetic-field coupling of the electromagnetic coupling module 3 can be achieved even when the electromagnetic coupling module 3 is disposed above the metallic flat plate 33 so as to be spaced therefrom while being subjected to suction by the suction bar 30.

Figure 8A:
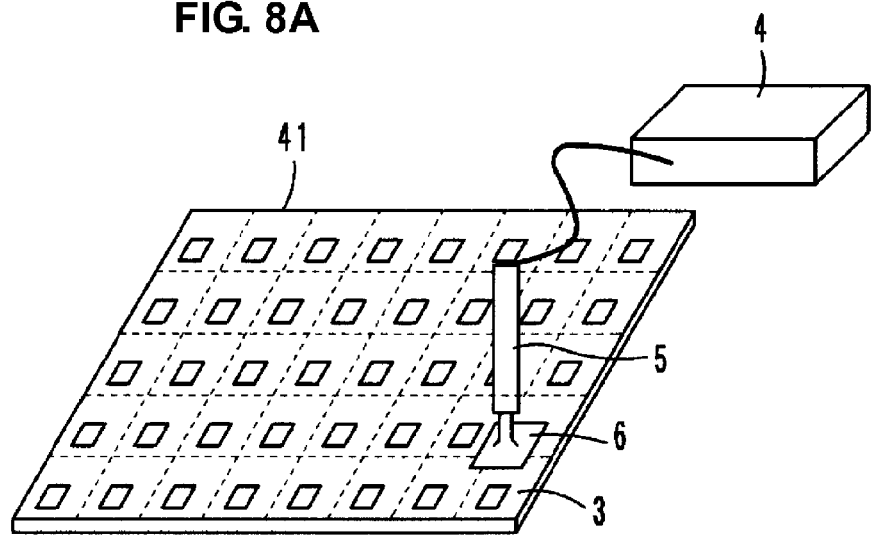
FIGS. 8A and 8B are schematic perspective views illustrating a second example of the inspecting process in the method for manufacturing electromagnetic coupling modules according to a preferred embodiment of the present invention.
Figure 8B:
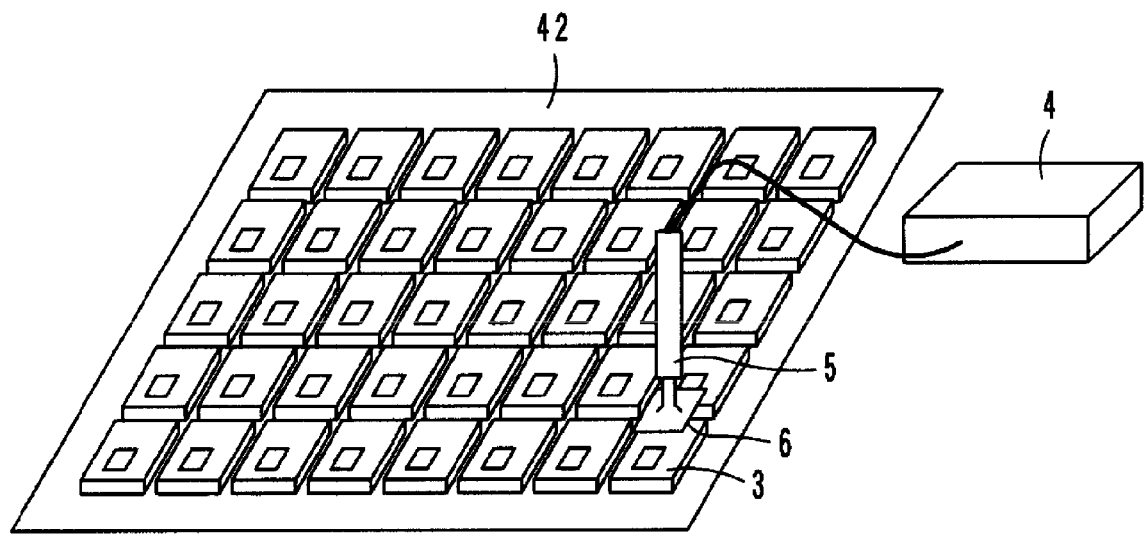

Second Example of Inspecting Process in Process of Manufacturing Electromagnetic Coupling Modules A second example of the inspecting process in the process of manufacturing the electromagnetic coupling modules 3 is described. FIGS. 8A and 8B schematically illustrate a second example of the inspecting process in the process of manufacturing the electromagnetic coupling modules 3.

That is, FIG. 8A illustrates a process of inspecting respective electromagnetic coupling modules 3 when the electromagnetic coupling modules 3 are disposed on a mother board 41. On the other hand, FIG. 8B illustrates a process of inspecting respective electromagnetic coupling modules 3 just after the mother board 41 provided with the electromagnetic coupling modules 3 has been cut by a dicer.

The mother board 41 is formed by performing printing on dielectric ceramic sheets so that a plurality of electrodes defining the feeder circuit illustrated in FIG. 5 are formed, laminating, crimping, and firing the ceramic sheets, and mounting radio IC chips 1 on respective portions defining the feeder circuit. Although not illustrated, the mother board 41 is substantially planarized by sealing the surface having the radio IC chips 1 mounted thereon with epoxy resin. By sealing the radio IC chips 1 with resin, the environment resistance of the radio IC chips 1 can be improved.

In the inspecting process illustrated in FIG. 8A, the respective electromagnetic coupling modules 3 are inspected in the state of the mother board 41. The probe 5 connected to the measuring device 4 is attached to a moving device (not illustrated) that is capable of automatically moving to the locations of the electromagnetic coupling modules 3 on the mother board 41. The moving device and the measuring device 4 are connected to a control computer (not illustrated).

Then, after instructions to inspect the electromagnetic coupling modules 3 are provided from the control computer to the moving device, the moving device moves the probe 5 to the location of the electromagnetic coupling module 3 to be inspected on the mother board 41. Then, the top portion 6 of the probe 5 is disposed above the surface of the electromagnetic coupling module 3 with or without a space therebetween so that the electromagnetic coupling module 3 and the top portion 6 of the probe 5 can be coupled to each other in an electromagnetic field. The method for inspecting the electromagnetic coupling modules 3 by the measuring device 4 under computer control is substantially the same as that in the above-described first example of the inspecting process in the process of manufacturing the electromagnetic coupling modules 3, and thus the description thereof is omitted.

At this time, the top portion 6 of the probe 5 radiates a weak electromagnetic field, so that the top portion 6 of the probe 5 is not significantly coupled to the electromagnetic coupling modules 3 other than the electromagnetic coupling module 3 that is in contact with or in close proximity to the top portion 6 of the probe 5. Therefore, in the inspecting process, each electromagnetic coupling module 3 can be accurately inspected without being adversely affected by the other electromagnetic coupling modules 3.

Then, in the inspecting process illustrated in FIG. 8B, the respective electromagnetic coupling modules 3 are inspected just after the mother board 41 provided with the electromagnetic coupling modules 3 has been cut by the dicer.

This inspecting process is performed to measure the electromagnetic coupling modules 3 when a stronger electromagnetic field is required to be radiated than that in the inspecting process illustrated in FIG. 8A. That is, the electromagnetic coupling module 3 operates the radio IC chip 1 by using the energy of electromagnetic waves for electromagnetic-field coupling from the top portion 6 of the probe 5. Thus, when the electrical energy to operate the radio IC chip 1 is relatively large, necessary energy of electromagnetic waves corresponding to the electrical energy must be radiated from the top portion 6 of the probe 5. In this case, the power of a transmission signal from the measuring device 4 is increased so as to strengthen the radiation of an electromagnetic field from the top portion 6 of the probe 5.

In such a case, if the top portion 6 of the probe 5 deviates by a large amount from the center of the electromagnetic coupling module 3 to be inspected and approaches an adjacent electromagnetic coupling module 3, accurate inspection cannot be performed due to an influence of the adjacent electromagnetic coupling module 3. In order to prevent such a problem, the mother board 41 is attached to a dicer adhesive sheet 42 and is cut by the dicer in advance, as illustrated in FIG. 8B. The electromagnetic coupling modules 3 adjacent to each other are separated from each other at intervals of the cutting width of the dicer (e.g., about 0.1 mm to about 0.2 mm). Thus, even if the top portion 6 of the probe 5 deviates by a large amount from the center of the electromagnetic coupling module 3 to be inspected, accurate inspection can be performed without being adversely influenced by an adjacent electromagnetic coupling module 3.

Furthermore, when the radiation level of an electromagnetic field from the top portion 6 of the probe 5 needs to be increased, the intervals between the electromagnetic coupling modules 3 may be further increased by expanding the size of the dicer adhesive sheet 42. Accordingly, accurate inspection can be performed without the adverse influence of an adjacent electromagnetic coupling module 3.

The control computer stores data about the locations of the electromagnetic coupling modules 3 determined to be an acceptable product or a defective product in the second example of the inspecting process illustrated in FIGS. 8A and 8B. Based on the data, acceptable products are transported to the taping process and defective products are transported to the defective-product tray in the next sorting process.

Figure 9:
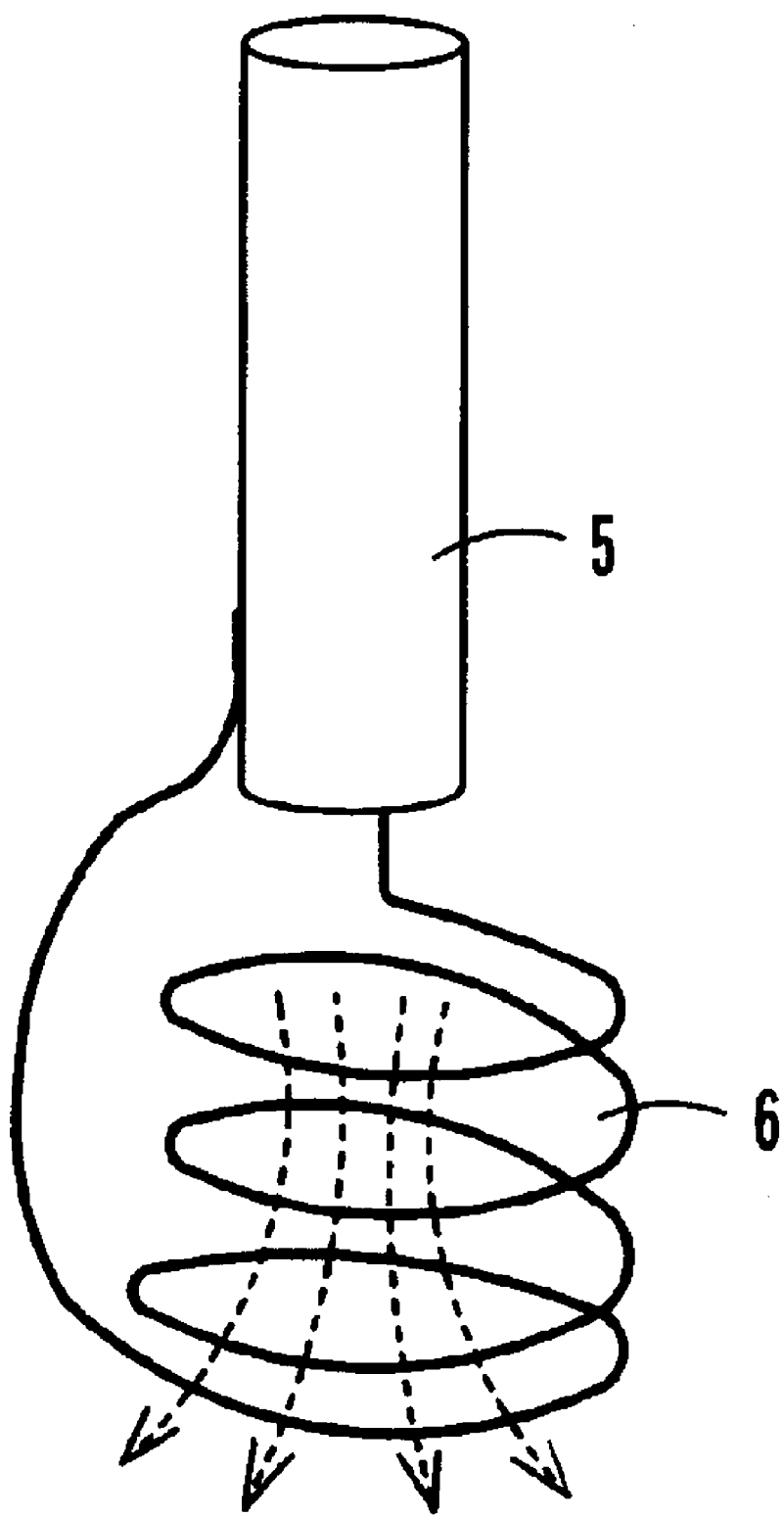
FIG. 9 is a schematic perspective view of another probe used in the inspecting process.

The top portion 6 of the probe 5 in the second example of the inspecting process illustrated in FIGS. 8A and 8B preferably has a substantially flat shape which enables electromagnetic-field coupling in which electrostatic coupling is relatively strong. However, a probe 5 whose top portion 6 has a coil shape may preferably be used as illustrated in FIG. 9, instead of the above-described probe. The probe 5 illustrated in FIG. 9 includes the coil-shaped top portion 6, and thus, achieves electromagnetic-field coupling in which electromagnetic coupling is relatively strong. The probe 5 having the coil-shaped top portion 6 radiates a large amount of electromagnetic field, and thus inspection can be performed even if the top portion 6 of the probe 5 does not contact the surface of the electromagnetic coupling module 3 to be inspected.

Figure 10A:
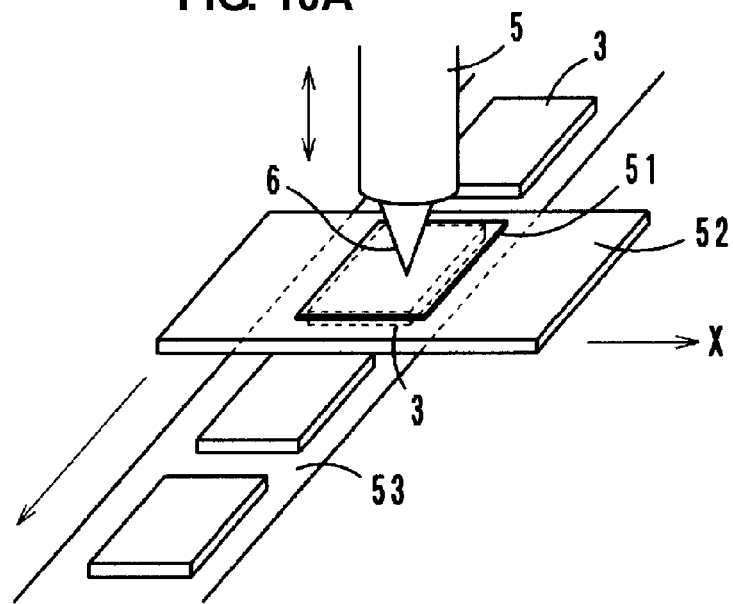
FIGS. 10A to 10C are a perspective view and cross-sectional views illustrating a third example of the inspecting process in the method for manufacturing electromagnetic coupling modules according to a preferred embodiment of the present invention.
Figure 10B:
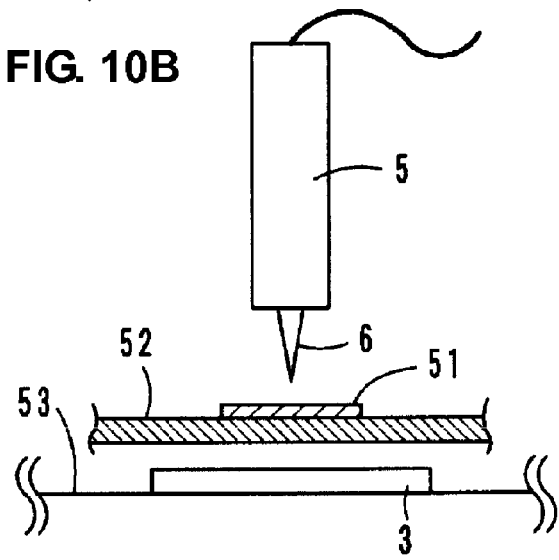
Figure 10C:
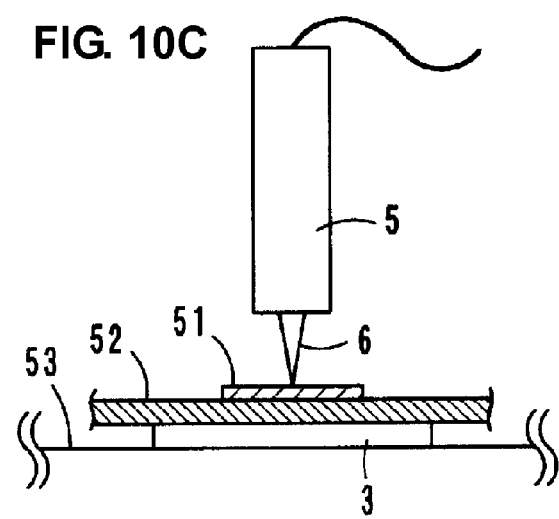

Third Example of Inspecting Process in Process of Manufacturing Electromagnetic Coupling Modules FIGS. 10A to 10C illustrate a third example of the inspecting process during manufacturing of the electromagnetic coupling modules 3.

That is, FIG. 10A illustrates a process of performing automatic inspection by disposing the electromagnetic coupling modules 3 on a conveyer belt 53. When the top portion 6 of the probe 5 is in contact with a flat substantially electrode 51 (e.g., an electrode preferably including a copper electrode film whose surface is nickel-plated and tinned, for example) provided on a resin film 52, the electromagnetic coupling modules 3 arranged on the conveyer belt 53 are coupled to the substantially flat electrode 51 provided on the resin film 52 in an electromagnetic filed, so as to inspect the electromagnetic coupling modules 3. The electromagnetic-field coupling is electromagnetic-field coupling primarily defined electrostatic coupling because the substantially flat plate 51 is used.

At this time, the probe 5 is connected to the measuring device 4 (see FIG. 1). In addition, the probe 5 is fixed to the moving device (not illustrated), and the electromagnetic coupling modules 3 are inspected by controlling the measuring device 4 and the moving device by the control computer. The method for inspecting the electromagnetic coupling modules 3 by the measuring device 4 under computer control is substantially the same as that in the above-described first and second examples of the inspecting process in the process of manufacturing the electromagnetic coupling modules 3, and thus the description thereof is omitted.

First, as illustrated in FIG. 10B, the electromagnetic coupling module 3 to be inspected is moved to a location under the substantially flat electrode 51 by moving the conveyer belt 53. Then, as illustrated in FIG. 10C, the probe 5 descends and presses the resin film 52 so as to be in contact with the electromagnetic coupling module 3 such that the probe 5 is in contact with the substantially flat plate 51. At this time, the resin film 52 having elasticity can be sufficiently brought into close contact with the electromagnetic coupling module 3, and thus, the substantially flat electrode 51 and the electromagnetic coupling module 3 can be adequately coupled to each other in an electromagnetic field. Accordingly, accurate inspection can be performed.

In addition, a plurality of substantially flat electrodes 51 (not illustrated) are arranged in the direction indicated by arrow X in FIG. 10A on the resin film 52. After a desired number (the maximum number that does not cause inspection failure) of electromagnetic coupling modules 3 have been measured in the inspecting process, the resin film 52 automatically moves in the direction indicated by arrow X, so that a new substantially flat electrode 51 is disposed under the probe 5. In this manner, inspection failure caused by degradation of the substantially flat electrode 51 is prevented.

Figure 11A:
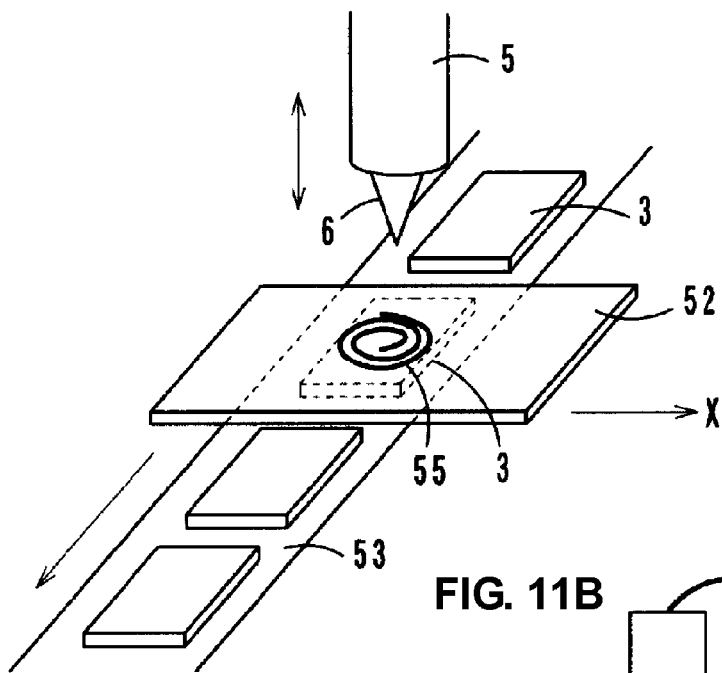
FIGS. 11A and 11C are a perspective view and cross-sectional views illustrating a fourth example of the inspecting process in the method for manufacturing electromagnetic coupling modules according to a preferred embodiment of the present invention.
Figure 11B:
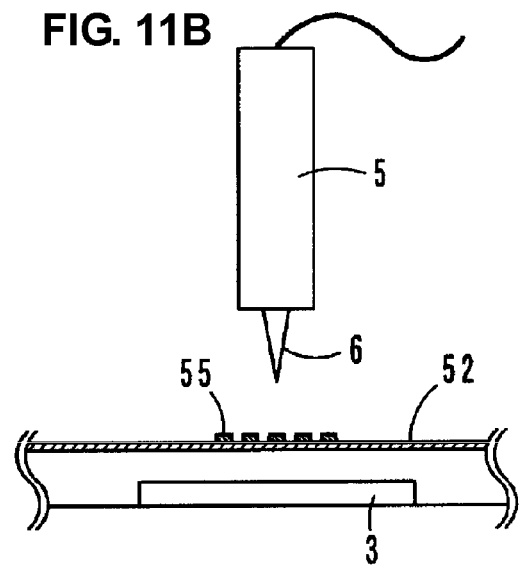
Figure 11C:
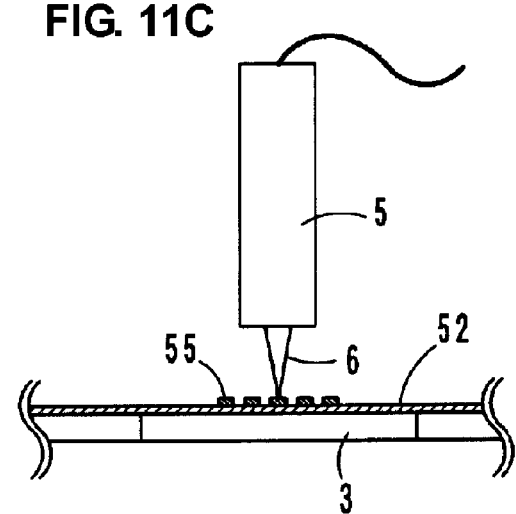

Fourth Example of Inspecting Process in Process of Manufacturing Electromagnetic Coupling Modules FIGS. 11A to 11C illustrate a fourth example of the inspecting process during manufacturing of the electromagnetic coupling modules 3.

That is, in the inspecting process illustrated in FIG. 11A, automatic inspection is performed by disposing the electromagnetic coupling modules 3 on the conveyer belt 53. That is, when the top portion 6 of the probe 5 is in contact with a spiral electrode 55 (e.g., an electrode preferably including a copper electrode film whose surface is nickel-plated and tinned) provided on the resin film 52, the electromagnetic coupling modules 3 arranged on the conveyer belt 53 are coupled to the top portion 6 and the spiral electrode 55 in an electromagnetic field, so as to inspect the electromagnetic coupling modules 3. The electromagnetic-field coupling at this time is electromagnetic-field coupling primarily based on electromagnetic coupling because the spiral plate 55 is used.

At this time, the probe 5 is connected to the measuring device 4 (see FIG. 1). The process 5 is fixed to the moving device (not illustrated), and the electromagnetic coupling modules are inspected by controlling the measuring device 4 and the moving device by the control computer. The method for inspecting the electromagnetic coupling modules 3 by the measuring device 4 under computer control is substantially the same as that in the above-described first to third examples of the inspecting process in the process of manufacturing the electromagnetic coupling modules 3, and thus the description thereof is omitted.

First, as illustrated in FIG. 11B, the electromagnetic coupling module 3 to be inspected is moved to the location under the spiral electrode 55 by moving the conveyer belt 53. Then, as illustrated in FIG. 11C, the probe 5 descends and presses the resin film 52 so as to be in contact with the electromagnetic coupling module 3 such that the probe 5 is in contact with an approximate center portion of the spiral electrode 55. At this time, the resin film 52 having elasticity can be sufficiently brought into close contact with the electromagnetic coupling module 3, and thus, the spiral electrode 55 and the electromagnetic coupling module 3 can be adequately coupled to each other in an electromagnetic field. Accordingly, accurate inspection can be performed.

In addition, a plurality of spiral electrodes 55 (not illustrated) are arranged in the direction indicated by arrow X in FIG. 11A on the resin film 52. After a desired number (the maximum number that does not cause inspection failure) of electromagnetic coupling modules 3 have been measured in the inspecting process, the resin film 52 automatically moves in the direction indicated by arrow X, so that a new spiral electrode 55 is disposed under the probe 5. In this manner, inspection failure caused by degradation of the spiral electrode 55 is prevented.

Another Example of Feeder Circuit Board of Electromagnetic Coupling Module

In the above-described preferred embodiment, an example of the feeder circuit board 2 of the electromagnetic coupling module 3 is illustrated in FIGS. 3 to 5. In the configuration of the feeder circuit 16 and the feeder circuit board 2 illustrated in FIGS. 3 to 5, the frequency range in which impedance matching between the radio IC chip 1 and the feeder circuit 16 is achieved and the frequency range in which impedance matching between the feeder circuit 16 and the space cannot be a wideband. Hereinafter, a description is provided of a feeder circuit board 2 that achieves impedance matching between the radio IC chip 1 and the feeder circuit 16 and impedance matching between the feeder circuit 16 and the space in a wideband frequency range with reference to FIGS. 12 to 14.

Figure 12:
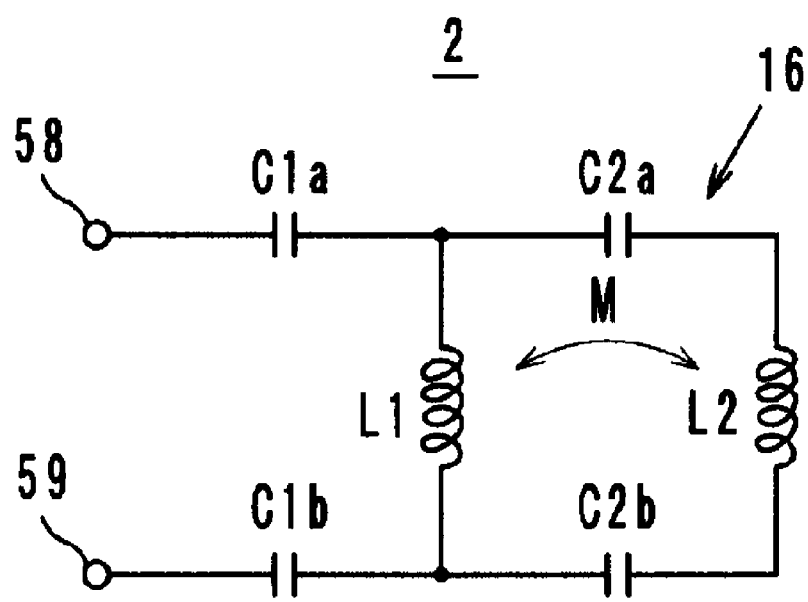
FIG. 12 is a circuit diagram of another feeder circuit board used in the electromagnetic coupling module.

As illustrated as an equivalent circuit in FIG. 12, the feeder circuit board 2 includes inductance elements L1 and L2 that are magnetically coupled to each other (indicated with symbol M). The inductance element L1 is connected to feeder terminals 58 and 59 via capacitance elements C1a and C1b and is also connected in parallel to the inductance element L2 via capacitance elements C2a and C2b. In other words, this resonance circuit includes an LC series resonance circuit including the inductance element L1 and the capacitance elements C1a and C1b and an LC series resonance circuit including the inductance element L2 and the capacitance elements C2a and C2b.

Figure 13:
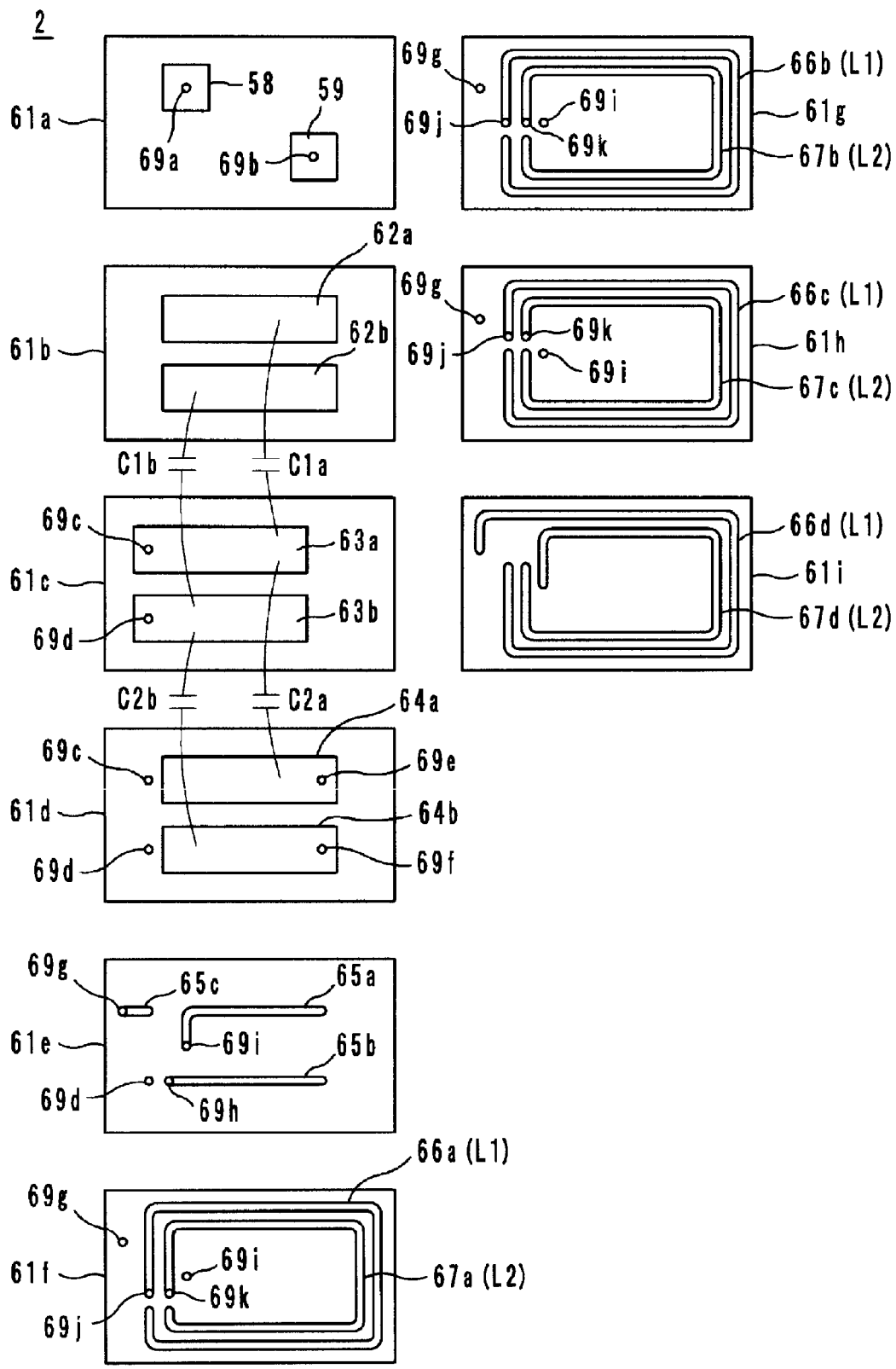
FIG. 13 is an exploded plan view of the feeder circuit board.

The feeder circuit board 2 having the above-described circuit configuration has a laminated structure as shown, for example, in FIG. 13, and is formed by laminating, crimping, and firing dielectric ceramic sheets 61a to 61i. That is, the sheet 61a is provided with the feeder terminals 58 and 59 and via-hole conductors 69a and 69b, the sheet 61b is provided with capacitor electrodes 62a and 62b, the sheet 61c is provided with capacitor electrodes 63a and 63b and via-hole conductors 69c and 69d, and the sheet 61d is provided with capacitor electrodes 64a and 64b and via-hole conductors 69c, 69d, 69e, and 69f.

Furthermore, the sheet 6ie is provided with connecting conductor patterns 65a, 65b, and 65c and via-hole conductors 69d, 69g, 69h, and 69i. The sheet 61f is provided with conductor patterns 66a and 67a and via-hole conductors 69g, 69i, 69j and 69k. The sheet 6ig is provided with conductor patterns 66b and 67b and via-hole conductors 69g, 69i, 69j, and 69k. The sheet 61h is provided with conductor patterns 66c and 67c and via-hole conductors 69g, 69i, 69j, and 69k. Furthermore, the sheet 61i is provided with conductor patterns 66d and 67d.

Lamination of the above-described sheets 61a to 61i connects the conductor patterns 66a to 66d via the via-hole conductors 69j so as to define the inductance element L1, and also connects the conductor patterns 67a to 67d via the via-hole conductors 69k so as to define the inductance element L2. The capacitance element C1a is defined by the electrodes 62a and 63a, and the capacitance element C1b is defined by the electrodes 62b and 63b. The capacitance element C2a is defined by the electrodes 63a and 64a, and the capacitance element C2b is defined by the electrodes 63b and 64b.

One end of the inductance element L1 is connected to the capacitor electrode 63a via the via-hole conductors 69g, the connecting conductor pattern 65c, and the via-hole conductors 69c. The other end thereof is connected to the capacitor electrode 63b via the via-hole conductors 69d. One end of the inductance element L2 is connected to the capacitor electrode 64a via the via-hole conductors 69i, the connecting conductor pattern 65a, and the via-hole conductors 69e. The other end thereof is connected to the capacitor electrode 64b via the via-hole conductor 69h, the connecting conductor pattern 65b, and the via-hole conductor 69f. The feeder terminal 58 is connected to the capacitor electrode 62a via the via-hole conductor 69a, and the feeder terminal 59 is connected to the capacitor electrode 62b via the via-hole conductor 69b.

In the feeder circuit board 2 having the above-described configuration, the LC series resonance circuit including the inductance elements L1 and L2 that are magnetically coupled to each other resonates, and the inductance elements L1 and L2 function as a radiating element. Furthermore, the inductance elements L1 and L2 couple to each other via the capacitance elements C2a and C2b so as to function as an impedance matching circuit of an apparatus connected to the feeder terminals 58 and 59 (about 50Ω in ordinary case) and an impedance of space (about 377Ω). A coupling coefficient k of the inductance elements L1 and L2 adjacent to each other is represented by $k^2 = M^2/(L1 \times L2)$, is preferably at least about 0.1, and is more preferably about 0.8975, for example. Furthermore, since the LC resonance circuits including the capacitance elements C1a, C1b, C2a, and C2b and the inductance elements L1 and L2 are defined as a lumped-constant resonance circuit, the resonance circuit can be miniaturized in a laminated type and is less likely to be adversely affected to another element. Furthermore, since the capacitance elements C1a and C1b are provided, a low-frequency surge can be cut and the apparatus can be protected against the low-frequency surge.

In the feeder circuit board 2, the plurality of LC series resonance circuits are formed using a laminated substrate, and thus the electromagnetic coupling module 3 including the radio IC chip 1 and the feeder circuit board 2 can be used as a radio IC module having a compact antenna that can be mounted on the surface of a substrate of a mobile phone or other suitable device. A combination of the electromagnetic coupling module and the radiator can preferably be used as a radio IC device, for example. Alternatively, the electromagnetic coupling module can be used as a radio IC device without combining it with the radiator.

Figure 14:
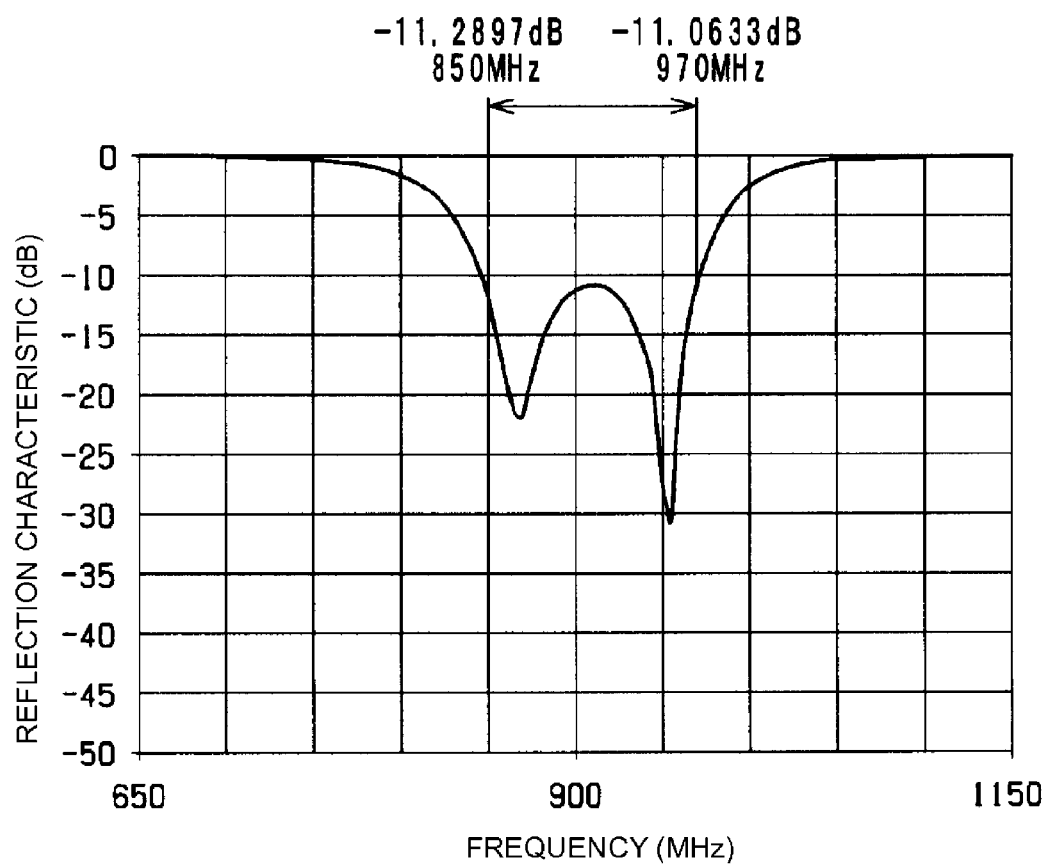
FIG. 14 is a graph showing a reflection characteristic of the feeder circuit illustrated in FIG. 12.

As a result of a simulation performed by the inventors of the present invention based on the equivalent circuit illustrated in FIG. 12, the reflection characteristic illustrated in FIG. 14 were obtained for the feeder circuit board 2. As shown in FIG. 14, the center frequency is about 915 MHz, and a reflection characteristic of at least about −10 dB could be obtained in a wideband of about 850 MHz to about 970 MHz.

Radio IC Device

Figure 15:
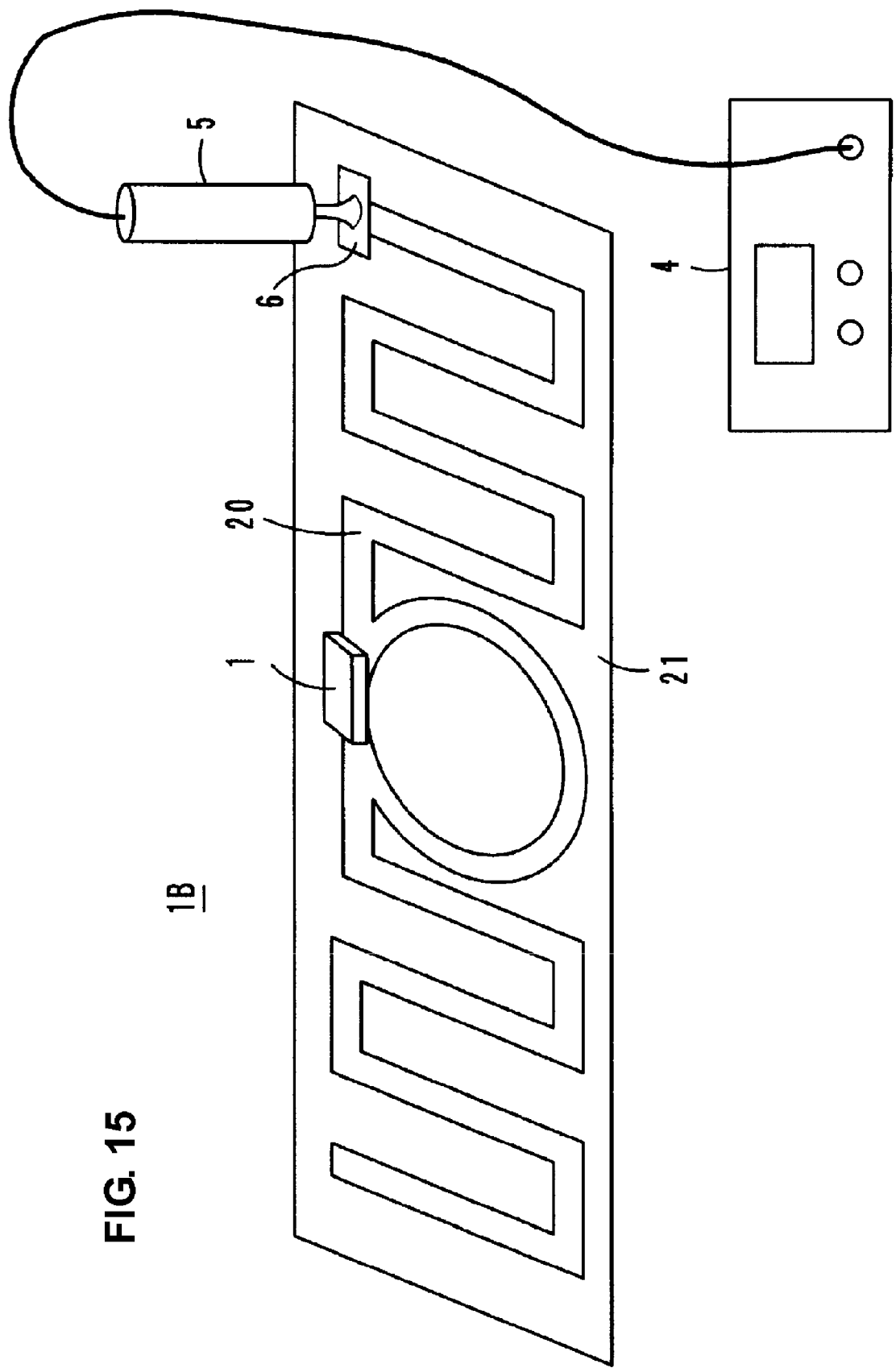
FIG. 15 is a perspective view illustrating another example of the radio IC device and the inspecting system.
Figure 16:
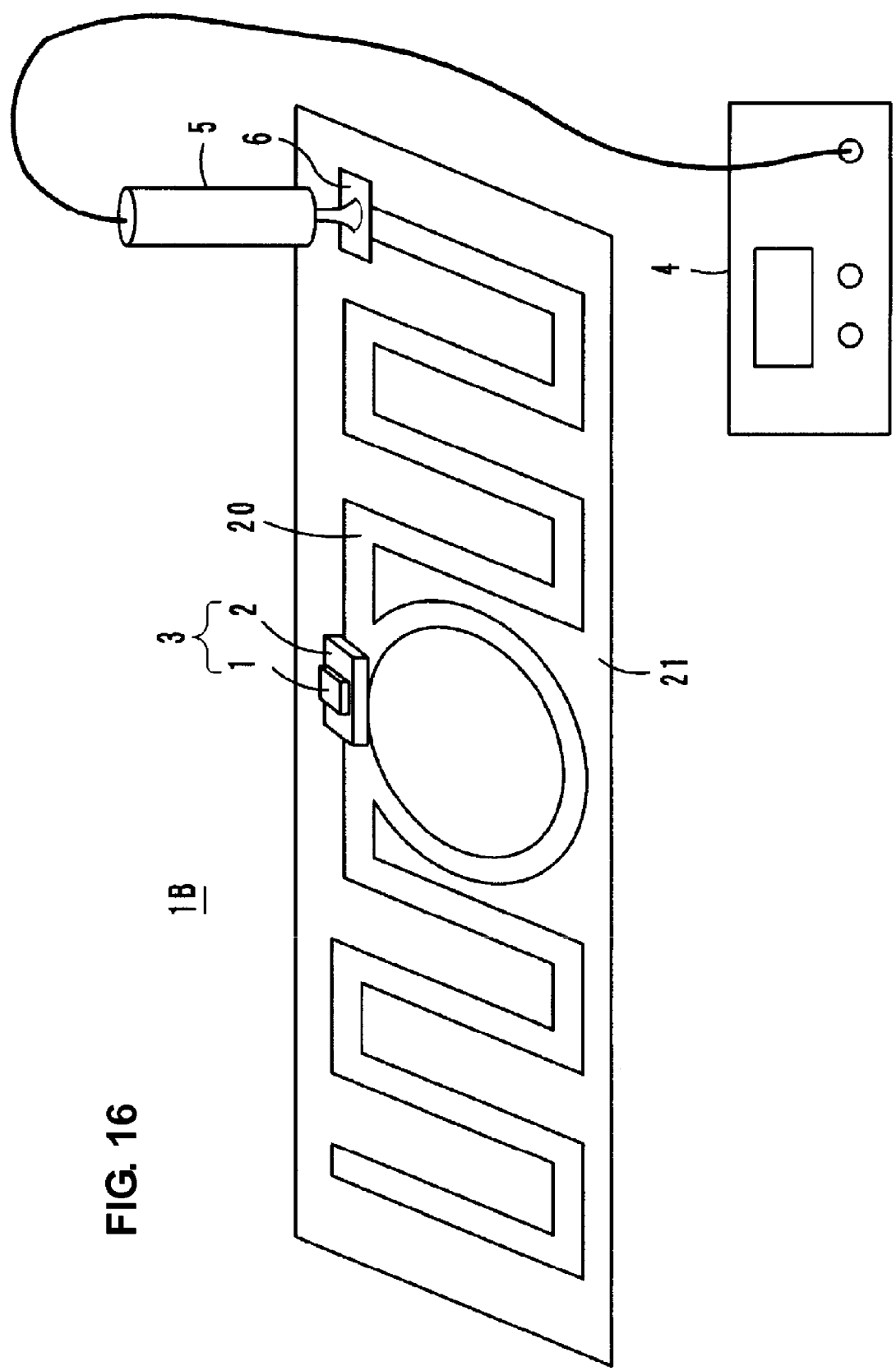
FIG. 16 is a perspective view illustrating another example of the radio IC device and the inspecting system.
Figure 17:
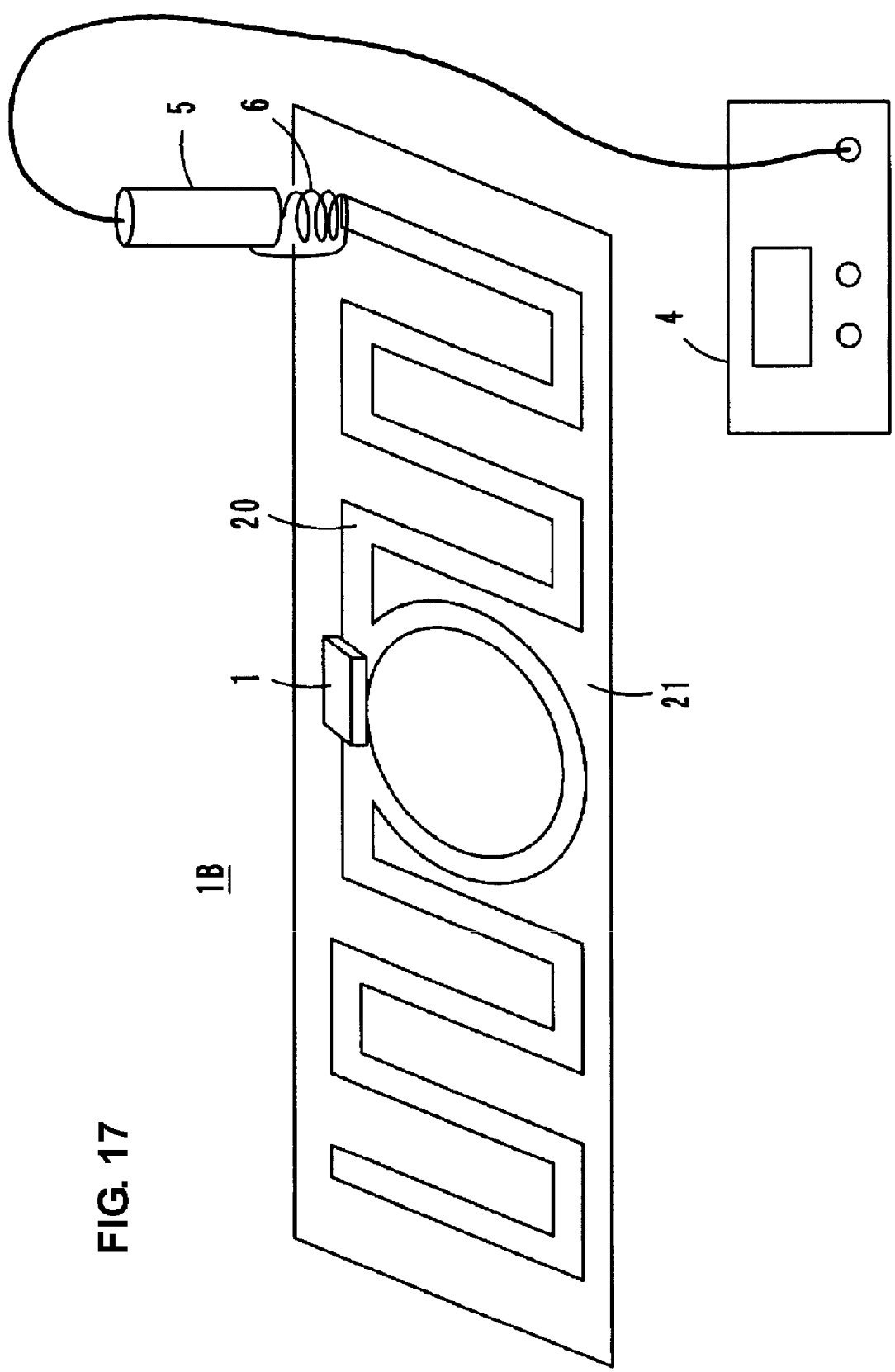
FIG. 17 is a perspective view illustrating another example of the radio IC device and anther example of the inspecting system.

Next, an example of a radio IC device as a target of the inspecting system according to a preferred embodiment of the present invention is described. As illustrated in FIGS. 15 to 17, a radio IC device 1B includes the radio IC chip 1 and the radiator 20 including a metallic thin film (see FIGS. 15 and 17) or includes the radio IC chip 1, the feeder circuit board 2, and the radiator 20 (see FIG. 16), and functions as a receiving and transmitting device for a reader/writer in the RFID system. The radio IC device 1B is used as an alternative to a barcode of a conventionally-used POS system or is used in management of distribution or fixed assets.

The radio IC chip 1 includes a clock circuit, a logic circuit, and a memory circuit, stores necessary information, and is connected to the radiator 20 either directly or via the feeder circuit board 2. The radiator 20 preferably has an elongated shape made of a non-magnetic material, such as aluminum foil or copper foil, for example, that is, a two-end-opened metallic thin film, and is provided on an insulating flexible resin film 21, such as PET, for example.

In the radio IC device 1B, the radiator 20 receives a radio frequency signal radiated from a reader/writer and supplies the received signal to the radio IC chip 1. On the other hand, the radio IC chip 1 extracts predetermined energy from the received signal, performs reflection modulation on the information stored in the radio IC chip 1 using the energy as a driving source so as to generate a transmission signal, and transmits the transmission signal from the radiator 20 to the reader/writer. In addition, the feeder circuit board 2 includes a feeder circuit including an inductance element to provide impedance matching between the radio IC chip 1 and the radiator 20. Specifically, the feeder circuit board 2 includes substantially the same feeder circuit 16 as that illustrated in FIGS. 3 to 5 and 12 and 13.

Inspecting System

The inspecting system for the radio IC device 1B preferably has substantially the same configuration as that of the measuring device 4 illustrated in FIG. 1. This inspecting system measures the characteristic of the radio IC device 1B by allowing the top portion of the probe 5 connected to the measuring device 4 to be in contact with or to disposed in close proximity to a portion of the radiator 20 via an insulating layer (not illustrated) so as to cause electromagnetic-field coupling between the top portion 6 of the probe 5 and the radiator 20. The top portion 6 of the probe 5 is a substantially flat plate. By ensuring an area facing the radiator 20, electrostatic coupling with the radiator 20 is increased. In addition, that stability of the contact with the insulating layer covering the radiator 20 is maintained. Furthermore, breakage of the insulating layer or the radiator 20 is prevented.

A memory of the measuring device 4 stores all of the inspection items of the radio IC device 1B and all of the specifications (usable frequency, command, and other parameters) of the RFID system. An inspection of the radio IC device 1B is performed in accordance with the inspection items.

Specifically, the type of RFID system used in the radio IC device 1B, a measuring frequency, and a command used to transmit/receive data that unique to the system are set, and the inspection items of the radio IC device 1B are set. Then, the probe 5 connected to the measuring device 4 is disposed near the radiator 20, and a signal (e.g., frequency shift keying signal) of information to be transmitted to the radio IC chip 1 is transmitted from a transmitter of the measuring device 4 to the probe 5.

The radio IC chip 1 performs demodulation and data processing of the signal received by the radiator 20 from the probe 5, converts the data transmitted to the measuring device 4 to a transmission data signal, and transmits the transmission data signal to the probe 5 from the radiator 20 by electromagnetic-field coupling. The transmission data signal is received by the probe 5 and is transmitted to the measuring device 4.

The measuring device 4 performs demodulation and data processing on the obtained data signal and determines whether the radio IC device 1B satisfies all the inspection items. If the radio IC device 1B satisfies the inspection items, the measuring device 4 determines that the inspected IC device 1B is an acceptable product. If the radio IC device 1B does not satisfy all of the inspection items, the measuring device 4 determines that the radio IC device 1B is a defective product.

During the above-described inspection, since the top portion of the probe 5 faces and is in close proximity to a portion of the radiator 20, a low-power inspection signal can be supplied from the probe 5 to the radio IC chip 1 via the radiator 20. Thus, the inspection signal is assuredly input to the radio IC device 1B to be inspected even when a plurality of radio IC devices are provided in close proximity to one another (see FIGS. 18 and 19).

Furthermore, a transmission data signal from the radio IC device 1B to be inspected is transmitted to the measuring device 4 from the radiator 20 directly via the probe 5, so that adjacent radio IC devices do not interfere with the measurement. When a plurality of radio IC devices 1B are sequentially inspected, no problem occurs even if the spacing between the radio IC devices 1B is relatively small, so that the inspection time and the manufacturing time are reduced.

The radio IC device 1B, including the radiator 20 on the resin film 21, the radio IC chip 1, and the feeder circuit board 2, is preferably covered with an insulating layer. Therefore, inspection is performed such that the top portion 6 of the probe 5 is in indirect contact with the radiator 20 via the insulating layer or in close proximity to the radiator 20. If the radiator 20 is not covered by the insulating film, inspection can be performed in a non-contact manner in which the top portion 6 of the probe 5 is in close proximity to the radiator 20 without a cover.

FIG. 16 illustrates an inspecting system for the radio IC device 1B including the feeder circuit board 2. This inspecting system is substantially the same as the inspecting system illustrated in FIG. 15.

FIG. 17 illustrates another example of the inspecting system for the radio IC device 1B. In this inspecting system, the top portion 6 of the probe 5 connected to the measuring device 4 has a magnetic-field generating unit. Specifically, the top portion 6 is a substantial loop-shaped coil portion, and the portion of the coil portion faces the pattern of the radiator 20 in close proximity.

Since the top portion 6 of the probe 5 is an elastic coil portion, magnetic-field coupling between the probe 5 and the radiator 20 is achieved. Furthermore, the closeness and the stability of the probe 5 with respect to the radiator 20 are further increased.

Figure 18:
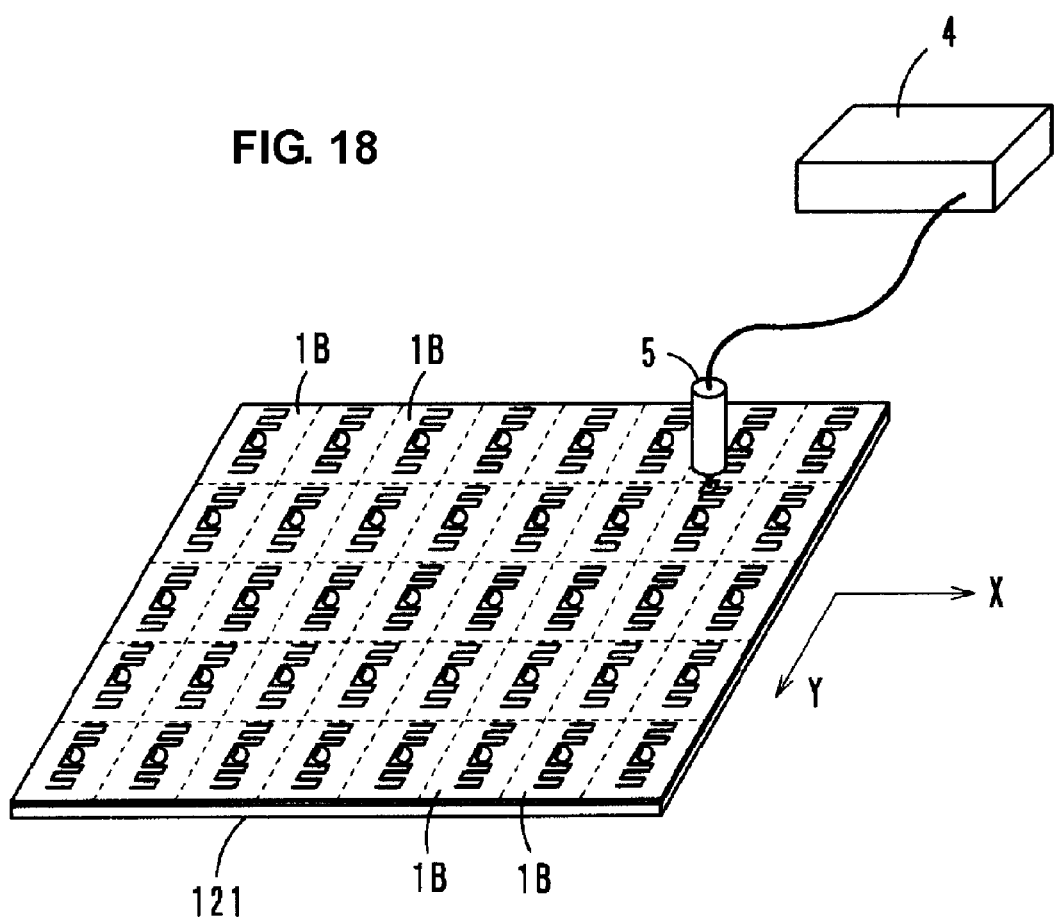
FIG. 18 is a perspective view illustrating a fifth example of the inspecting process in a method for manufacturing radio IC devices according to a preferred embodiment of the present invention.

Fifth Example of Inspecting Process in Process of Manufacturing Radio IC Devices Next, a fifth example of an inspecting process in a process of manufacturing the radio IC devices 1B is described with reference to FIG. 18. In the fifth example of the inspecting process, many radio IC devices 1B are arranged on a rigid supporting plate 121 in a matrix pattern. The many radio IC devices 1B are sequentially inspected by moving the supporting plate 121 or the probe 5 in X and Y directions.

Figure 19:
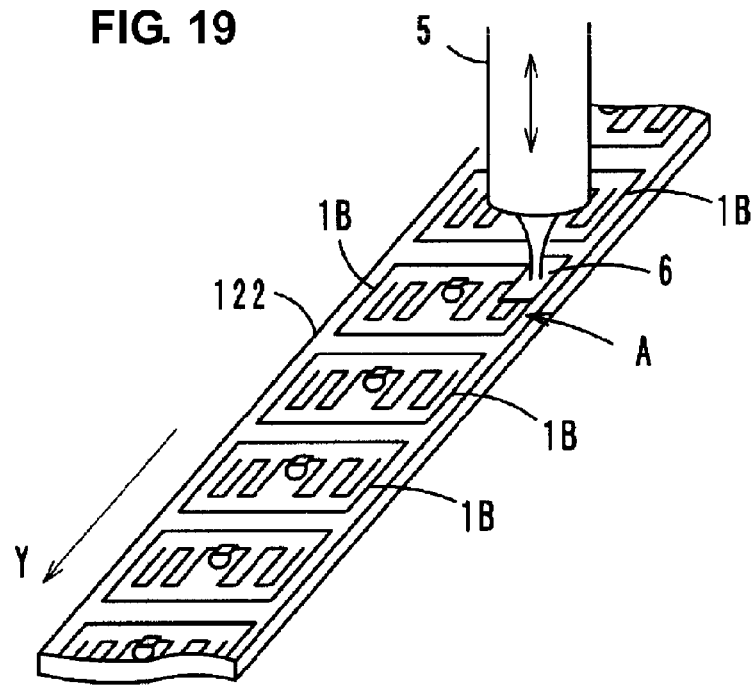
FIG. 19 is a perspective view illustrating a sixth example of the inspecting process in the method for manufacturing radio IC devices according to a preferred embodiment of the present invention.

Sixth Example of Inspecting Process in Process of Manufacturing Radio IC Devices Next, a sixth example of the inspecting process in the process of manufacturing the radio IC devices 1B is described with reference to FIG. 19. In the sixth example of the inspecting process, many radio IC devices 1B are arranged on a rigid supporting plate 122 and are intermittently conveyed in the direction indicated by arrow Y. Then, the radio IC devices 1B are sequentially inspected by the probe 5 when each of the radio IC devices 1B is disposed at a predetermined location A.

Figure 20A:
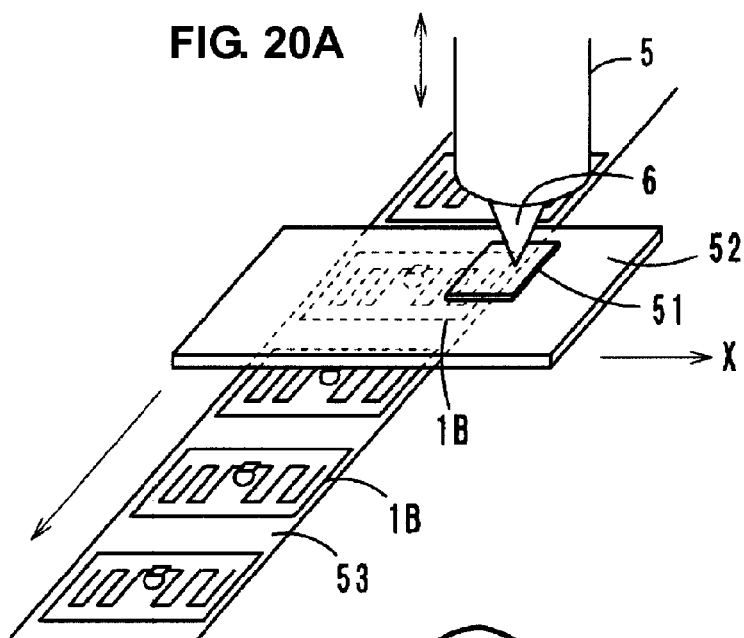
FIGS. 20A, 20B and 20C are a perspective view and cross-sectional views illustrating a seventh example of the inspecting process in the method for manufacturing radio IC devices according to a preferred embodiment of the present invention.
Figure 20B:
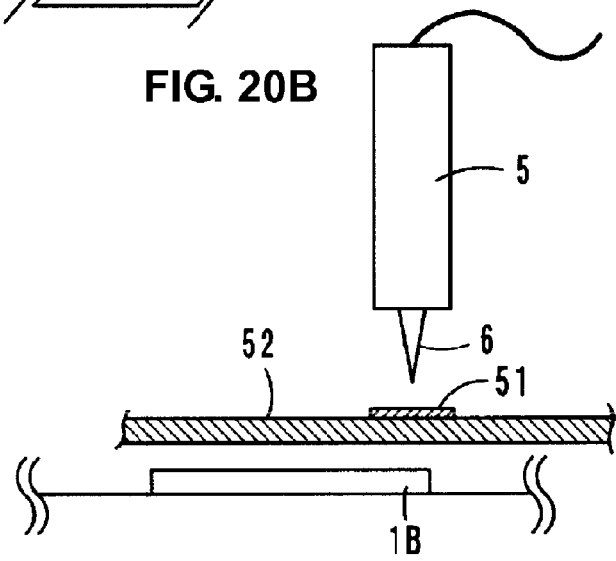
Figure 20C:
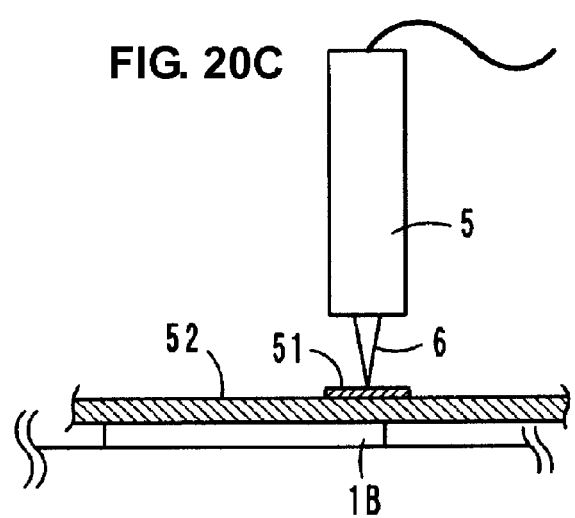

Seventh Example of Inspecting Process in Process of Manufacturing Radio IC Devices A seventh example of the inspecting process during manufacturing of the radio IC devices 1B illustrated in FIGS. 20A to 20C is substantially the same as the third example of the inspecting process illustrated in FIGS. 10A to 10C. The radio IC devices 1B are disposed on the conveyer belt 53 and are intermittently conveyed so as to perform automatic inspection. The substantially flat electrode 51 provided on the resin film 52 faces a portion of the radiator 20 of the radio IC device 1B in close proximity so as to achieve electromagnetic-field coupling primarily by electrostatic coupling, whereby signals are transmitted.

Figure 21A:
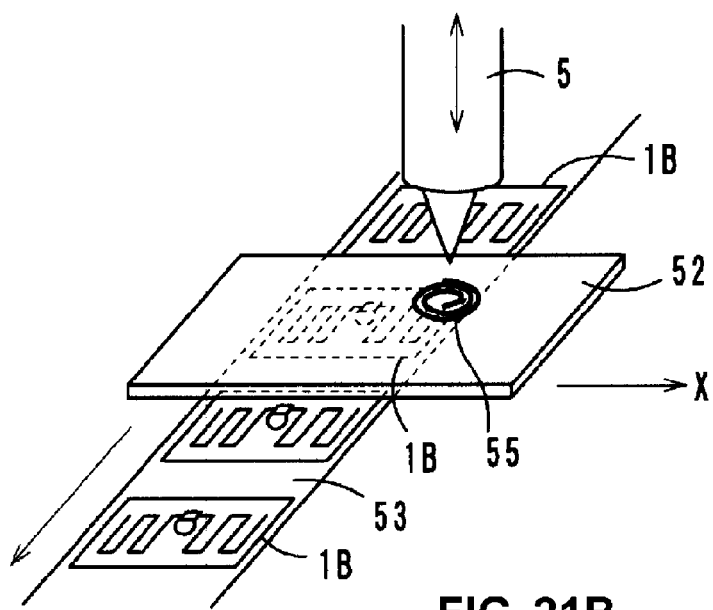
FIGS. 21A, 21B and 21C are a perspective view and cross-sectional views illustrating an eighth example of the inspecting process in the method for manufacturing radio IC devices according to a preferred embodiment of the present invention.
Figure 21B:
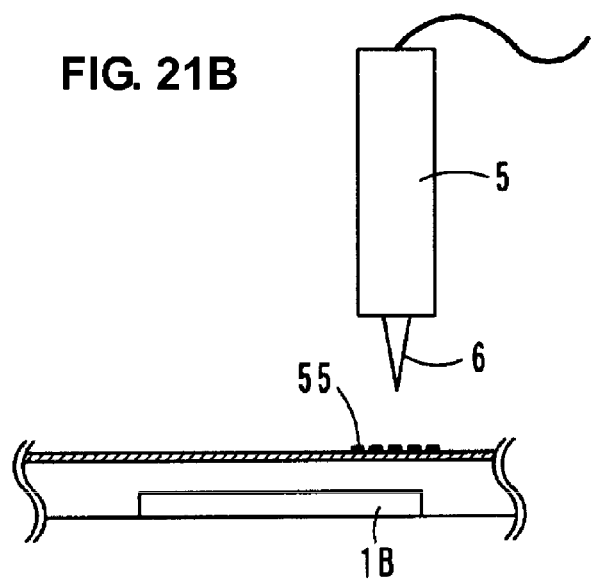
Figure 21C:
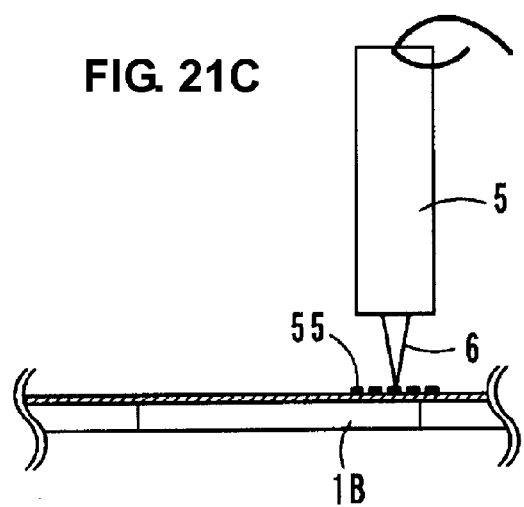

Eighth Example of Inspecting Process in Process of Manufacturing Radio IC Devices An eighth example of the inspecting process during manufacturing of the radio IC devices 1B illustrated in FIGS. 21A to 21C is substantially the same as example 4 of the inspecting process illustrated in FIGS. 11A to 11C. The radio IC devices 1B are disposed on the conveyer belt 53 and are intermittently conveyed so as to perform automatic inspection. The spiral electrode 55 provided on the resin film 52 faces a portion of the radiator 20 of the radio IC device 1B in close proximity so as to achieve electromagnetic-field coupling primarily by electromagnetic coupling, whereby signals are transmitted.

The system for inspecting electromagnetic coupling modules and radio IC devices and the method for manufacturing electromagnetic coupling modules and radio IC devices according to preferred embodiments of the present invention are not limited to the above-described preferred embodiment, and can be variously modified in the scope of the present invention.

For example, details such as the shape of the probe 5 are arbitrary. In addition, the configuration of the electromagnetic coupling module and the feeder circuit board and the shape of the radiator are arbitrary. Furthermore, a connection structure between the radiator and the radio IC chip or the feeder circuit board is arbitrary.

As described above, preferred embodiments of the present invention are useful in a system for inspecting electromagnetic coupling modules and radio IC devices and a method for manufacturing electromagnetic coupling modules and radio IC devices, and is particularly excellent in being capable of efficiently inspecting electromagnetic coupling modules and radio IC devices in short time.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A system for inspecting an electromagnetic coupling module including a radio IC chip and a feeder circuit board on which the radio IC chip is mounted, the feeder circuit board having a feeder circuit including an inductance element disposed thereon, the system comprising:
   a measuring device including a probe; wherein
   the electromagnetic coupling module is measured by electromagnetically coupling the probe of the measuring device to the electromagnetic coupling module by at least one of electrostatic coupling and electromagnetic coupling; and
   a metallic film is disposed between the probe of the measuring device and the electromagnetic coupling module, and the probe of the measuring device is electrically connected to the metallic film.

2. The system for inspecting electromagnetic coupling modules according to claim 1, wherein a top portion of the probe of the measuring device is a substantially flat plate.

3. The system for inspecting electromagnetic coupling modules according to claim 1, wherein a top portion of the probe of the measuring device is substantially coil shaped.

4. The system for inspecting electromagnetic coupling modules according to claim 1, wherein the metallic film is disposed on an insulating film.

5. The system for inspecting electromagnetic coupling modules according to claim 1, wherein a coil conductor is disposed between the probe of the measuring device and the electromagnetic coupling module and the probe of the measuring device is electrically connected to the coil conductor.

6. The system for inspecting electromagnetic coupling modules according to claim 5, wherein the coil conductor is disposed on an insulating film.

7. A method for manufacturing electromagnetic coupling modules, the method comprising the steps of:
   providing the system for inspecting an electronic coupling module according to claim 1;
   forming a plurality of electromagnetic coupling modules on a mother board by providing a plurality of feeder circuits including an inductance element in the mother board and mounting a radio IC chip on each of the plurality of feeder circuits provided in the mother board;
   individually inspecting the plurality of electromagnetic coupling modules on the mother board using the system for inspecting an electromagnetic coupling module; and
   separating the plurality of electromagnetic coupling modules on the mother board from each other.

8. A method for manufacturing electromagnetic coupling modules, the method comprising the steps of:
   providing the system for inspecting an electronic coupling module according to claim 1;
   forming a plurality of electromagnetic coupling modules on a mother board by providing a plurality of feeder circuits including an inductance element in the mother board and mounting a radio IC chip on each of the plurality of feeder circuits provided in the mother board;
   attaching the mother board onto an adhesive sheet and separating the electromagnetic coupling modules from each other; and
   individually inspecting the plurality of electromagnetic coupling modules using the system for inspecting an electromagnetic coupling module.

9. A method for manufacturing electromagnetic coupling modules, the method comprising the steps of:
   providing the system for inspecting an electronic coupling module according to claim 1;
   forming a plurality of electromagnetic coupling modules on a mother board by providing a plurality of feeder circuits including an inductance element in the mother board and mounting a radio IC chip on each of the plurality of feeder circuits provided in the mother board;
   attaching the mother board onto an adhesive sheet, separating the plurality of electromagnetic coupling modules from each other, and then increasing intervals between the plurality of electromagnetic coupling modules adjacent to each other by expanding the adhesive sheet; and
   individually inspecting the plurality of electromagnetic coupling modules using the system for inspecting an electromagnetic coupling module.

10. A system for inspecting an electromagnetic coupling module including a radio IC chip and a feeder circuit board on which the radio IC chip is mounted, the feeder circuit board having a feeder circuit including an inductance element disposed thereon, the system comprising:

a measuring device including a probe; wherein
the electromagnetic coupling module is measured by electromagnetically coupling the probe of the measuring device to the electromagnetic coupling module by at least one of electrostatic coupling and electromagnetic coupling; and
quality of a radio IC device including the electromagnetic coupling module and a radiator arranged to be coupled to the electromagnetic coupling module by at least one of electrical-field coupling and magnetic-field coupling is inspected based on measurement data of the system for inspecting electromagnetic coupling modules.

11. A system for inspecting a radio IC device including a radio IC chip and a radiator, the system comprising:

a measuring device including a probe; wherein
the radio IC device is measured by electromagnetically coupling the probe of the measuring device to a portion of the radiator by at least one of electrostatic coupling and electromagnetic coupling; and
a metallic film is disposed between the probe of the measuring device and the radio IC device and the probe of the measuring device is electrically connected to the metallic film.

12. The system for inspecting radio IC devices according to claim 11, wherein a top portion of the probe of the measuring device is a substantially flat plate.

13. The system for inspecting radio IC devices according to claim 11, wherein a top portion of the probe of the measuring device is substantially coil shaped.

14. The system for inspecting radio IC devices according to claim 11, wherein the metallic film is disposed on an insulating film.

15. The system for inspecting radio IC devices according to claim 11, wherein a coil conductor is disposed between the probe of the measuring device and the radio IC device and the probe of the measuring device is electrically connected to the coil conductor.

16. The system for inspecting radio IC devices according to claim 15, wherein the coil conductor is disposed on an insulating film.

17. A method for manufacturing radio IC devices, the method comprising:

providing the system for inspecting a radio IC device according to claim 11;
forming a plurality of radio IC devices;
inspecting the plurality of radio IC devices using the system for inspecting a radio IC device; and
separating the plurality of radio IC devices from each other.

18. A system for inspecting a radio IC device including a radio IC chip, a feeder circuit board on which the radio IC chip mounted is mounted, the feeder circuit board includes a feeder circuit including an inductance element, and a radiator that is attached to the feeder circuit board and arranged to radiate a transmission signal supplied from the feeder circuit and receive a reception signal and supply the reception signal to the feeder circuit, the system comprising:

a measuring device including a probe; wherein
the radio IC device is measured by electromagnetically coupling a probe of a measuring device to a portion of the radiator by at least one of electrostatic coupling and electromagnetic coupling; and
a metallic film is disposed between the probe of the measuring device and the radio IC device and the probe of the measuring device is electrically connected to the metallic film.

19. The system for inspecting radio IC devices according to claim 18, wherein a top portion of the probe of the measuring device is a substantially flat plate.

20. The system for inspecting radio IC devices according to claim 18, wherein a top portion of the probe of the measuring device is substantially coil shaped.

21. The system for inspecting radio IC devices according to claim 18, wherein the metallic film is disposed on an insulating film.

22. The system for inspecting radio IC devices according to claim 18, wherein a coil conductor is disposed between the probe of the measuring device and the radio IC device and the probe of the measuring device is electrically connected to the coil conductor.

23. The system for inspecting radio IC devices according to claim 22, wherein the coil conductor is disposed on an insulating film.

24. A method for manufacturing radio IC devices, the method comprising:

providing the system for inspecting a radio IC device according to claim 18;
forming a plurality of radio IC devices;
inspecting the plurality of radio IC devices using the system for inspecting a radio IC device; and
separating the plurality of radio IC devices from each other.

* * * * *